US011669419B1

(12) United States Patent
Abuhamdeh et al.

(10) Patent No.: US 11,669,419 B1
(45) Date of Patent: Jun. 6, 2023

(54) SYSTEM AND METHOD FOR PERFORMING A FAILURE ASSESSMENT OF AN INTEGRATED CIRCUIT

(71) Applicant: Marvell Asia Pte, Ltd., Singapore (SG)

(72) Inventors: Zahi Abuhamdeh, Billerica, MA (US); Nitin Mohan, Northborough, MA (US); Kandadi Vasudevan, Southborough, MA (US); Thucydides Xanthopoulos, Watertown, MA (US); Tyler Albarran, Boston, MA (US); Peter Rickenbach, Sudbury, MA (US)

(73) Assignee: MARVELL ASIA PTE, LTD., Singapore (SG)

( * ) Notice: Subject to any disclaimer, the term of this patent is extended or adjusted under 35 U.S.C. 154(b) by 773 days.

(21) Appl. No.: 16/696,789

(22) Filed: Nov. 26, 2019

Related U.S. Application Data

(60) Provisional application No. 62/771,466, filed on Nov. 26, 2018.

(51) Int. Cl.
G06F 11/07 (2006.01)
G06F 11/26 (2006.01)
G06F 1/08 (2006.01)
G06F 16/2455 (2019.01)

(52) U.S. Cl.
CPC .............. G06F 11/26 (2013.01); G06F 1/08 (2013.01); G06F 16/24558 (2019.01)

(58) Field of Classification Search
CPC ....... G06F 11/26; G06F 1/08; G06F 16/24558
See application file for complete search history.

(56) References Cited

U.S. PATENT DOCUMENTS

| | | | |
|---|---|---|---|
| 9,628,255 B1* | 4/2017 | Baidas | H04L 7/0008 |
| 10,055,369 B1* | 8/2018 | Tucker | G06F 9/5038 |
| 11,290,095 B1* | 3/2022 | Patel | H03K 5/05 |
| 2009/0006894 A1* | 1/2009 | Bellofatto | G06F 11/2236 714/34 |
| 2019/0094298 A1* | 3/2019 | Kusko | G01R 31/318371 |

* cited by examiner

Primary Examiner — Yair Leibovich
Assistant Examiner — Kyle Emanuele
(74) Attorney, Agent, or Firm — Hamilton, Brook, Smith & Reynolds, P.C.

(57) ABSTRACT

A system for performing a failure assessment of an IC may comprise a hardware subsystem and a control subsystem to control operations performed by the hardware subsystem. The hardware system may change a duration of cycles of a clocking signal on the IC, and stop the clocking signal at a selected clock cycle. The operations may comprise changing the duration of selected clock cycles across a block of clock cycles, and performing a binary search across the block of clock cycles, such that the selected clock cycles are temporally placed at selected different locations within the block of clock cycles. At each iteration of the binary search, the system determines when a failure occurs. When the binary search indicates a single clock cycle causing a failure, the system stops clocking transitions at the single clock cycle, and the system extracts data from one or more circuit components of the IC.

20 Claims, 28 Drawing Sheets search_cycle_start - 64 bit value that designates where the procedure should begin searching for a failure. There will be a minimum value that is determined by the timing path for the control signals to propagate across the circuit block.

search_cycle_stop – 64 bit value that designates where the algorithm should stop searching for a failure.

shrink_settings – 2 bit value that designates what shrink technique will be used.

delay_settings – 3 bit value that selects the amount of time (in pS) to shrink the clock.

ap_sel - 6 bit select value that determines which ap core to analyze. Set to 0 in order to use the ct_sel.

ct_sel – 3 bit one hot field, which selects the block for analysis in addition to ap_sel.

FIG. 1B

- Minimum Fail Cycle

- Scanned register contents of the block at the first fail cycle

FIG. 1C

/********* Main function **********/

Load inputs from algorithm description:

1) search_cycle_start
    2) search_cycle_stop
    3) shrink_settings
    4) delay_settings
    5) ct_sel
    6) ap_sel /* Even Cycles Test */

```
// Initialize settings for even cycle test
if ((search_cycle_start %2) != 0):
        shrink_start_index = search_cycle_start + 1
else:
        shrink_start_index = search_cycle_start
shrink_stop_index = search_cycle_stop
csk_en = 0
shrink_clk_mode = 1
stop_clk_mode = 0
shrink_settings = shrink_settings
clock_delay_select = delay_settings
stop_count = 0 write_CSRs()
even_error_found = run_test()
if (even_error_found):
        even_min = find_min_fail_index(shrink_start_index,shrink_stop_index)

/* Odd Cycles Test */

// Setup settings for odd cycle test
if ((search_cycle_start %2) == 0):
        shrink_start_index = search_cycle_start + 1
else:
        shrink_start_index = search_cycle_start
shrink_stop_index = search_cycle_stop
csk_en = 0
shrink_clk_mode = 1
```

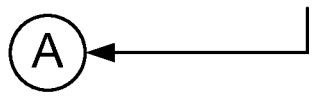

FIG. 3A

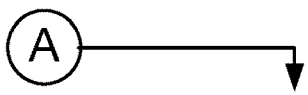

```
stop_clk_mode = 0
shrink_settings = shrink_settings
clock_delay_select = delay_settings
stop_count = 0 write_CSRs()
odd_error_found = run_test()
if (odd_error_found):
        odd_min = find_min_fail_index(shrink_start_index,shrink_stop_index)

if (odd_error_found && !even_error_found):
        cycle_fail_index = odd_min
else if (!odd_error_found && even_error_found):
        cycle_fail_index = even_min
else if(odd_error_found && even_error_found):
        cycle_fail_index = min(even_min,odd_min)
else:
        cycle_fail_index = -1 // no failure found return cycle_fail_index /******** Helper functions ********/

// binary search function with preference for lower indices in array
// tested with a python script – may need more debugging with the feature
int find_min_fail_index(start_index,stop_index)

// make sure there is a valid input
        if ((stop_index - start_index) < 2):
                return start_index // check if start is even or odd
        if (start_index %2 == 0):
                even_odd = 1
        else:
                even_odd = 0

// Initialization of bounds
        min_index = 0
        found = 0
        first_bound = start_index
        last_bound = stop_index
        // Makes it easier if first and last bound have same polarity
        if (!even_odd && (last_bound % 2 == 0)):
                last_bound = last_bound - 1
        else if (even_odd && (last_bound % 2 != 0)):
                last_bound = last_bound - 1
```

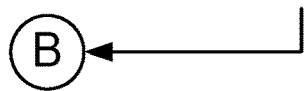

FIG. 3B

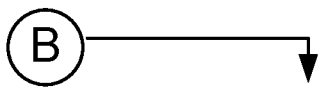

```
// main loop
while (!found):
        // Initialize settings for lower half test
        shrink_start_index = first_bound
        shrink_stop_index = floor(last_bound/2 + first_bound/2
        // Change stop bound to be same polarity as first
        if (!even_odd && (shrink_stop_index % 2 == 0)):
                shrink_stop_index = shrink_stop_index - 1
        else if (even_odd && (shrink_stop_index % 2 != 0)):
                shrink_stop_index = shrink_stop_index - 1 csk_en = 0
        shrink_clk_mode = 1
        stop_clk_mode = 0
        shrink_settings = shrink_settings
        clock_delay_select = delay_settings
        stop_count = 0

// setup and run test
        write_CSRs()
        error_found = Run_test()
        // error is in first half
        if (error_found):
                if ((shrink_stop_index - shrink_start_index) == 1):
                        min_index = first_bound
                        found = 1
                else:
                        last_bound = shrink_stop_index
        // error is in other half
        else:
                if ((last_bound - (shrink_start_index+2)) <= 4):
                        min_index = shrink_stop_index + 2
                        found = 1
                else:
                        first_bound = shrink_stop_index + 2
                        //maintain polarity of start index
                        if (!even_odd && (first_bound % 2 == 0)):
                                first_bound = first_bound - 1
                        else if (even_odd && (first_bound % 2 != 0)):
                                first_bound = first_bound - 1 return min_index
```

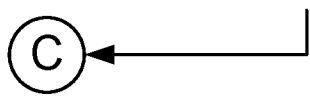

FIG. 3C

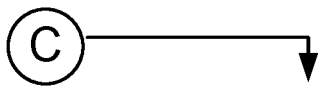

```
int run_test(int cycle_count_TC)
    csr_csk_ctl_reg.csk_en = 1 // enables FSM
    chip_start() // fsm starts when rstpwr is deasserted for a block while (!done):
            // predetermined value to allow all tests to be predictable)
            if (cycle_count == cycle_count_TC)
                    done = 1
    stop_count = 1 in CSR // disables FSM counter
    error = check_for_error()
    stop_count = 0 in CSR// stop FSM counter
    csk_en = 0 in CSR// reset FSM return error // open ended function that boots up chip and powers up selected ap core
chip_start(void)

// open ended function that checks if any logic assertions have failed
check_for_error()

// Upload settings to CSRs
writeCSRs(void)
    csr_csk_ctl_reg.csk_en = csk_en
    csr_csk_ctl_reg.shrink_clk_mode = shrink_clk_mode
    csr_csk_ctl_reg.stop_clk_mode = stop_clk_mode
    csr_csk_ctl_reg.shrink_settings = shrink_settings
    csr_csk_ctl_reg.clock_delay_select = clock_delay_select
    csr_csk_ctl_reg.stop_count = stop_count
    csk_ap_select.ct_sel = ct_sel
    csk_ap_select.ap_sel = ap_sel
    shrink_start_index = shrink_start_index
    shrink_stop_index = shrink_stop_index
    clk_stop_index = clk_stop_index
```

FIG. 3D

```
// Prepare settings for test
shrink_start_index = first_fail_cycle
shrink_stop_index = first_fail_cycle
clk_stop_index = first_fail_cycle + 2(determined based on difference in propagation -
verify before using this to determine timing failure locations)
csk_en = 0
shrink_clk_mode = 1
stop_clk_mode = 1
shrink_settings = shrink_settings
clock_delay_select = delay_settings
stop_count = 0 writeCSRs()

csr_csk_ctl_reg.csk_en = 1 in CSR // enables FSM
chip_start()

while (!done):
        if (cycle_count == first_fail_cycle + 60):  //  2xpropagation delay - should verify
                done = 1 scan_dump()
chip_reset() // Only way to recover from this is to perform a chip reset
```

FIG. 4

| Bit(s) | Name | Access | Reset | Description |
|---|---|---|---|---|
| 63:9 | csk_send | R/W | 0 | Reserved struct. |
| 8 | stop_test | R/W | 0 | Stops the cycle counter within the FSM. Set to 1 to stop the cycle counter. Must be cleared to 0 during the IDLE state of the FSM in order to start another test. |
| 7:5 | clock_delay_select | R/W | 0 | Specifies the amount of delay to use for the clock shrink. 3'b000 selects zero delay and thus will not create a shrink. |
| 4:3 | shrink_settings | R/W | 0 | Specifies the type of shrink to occur. The MSB specifies whether the shrink is rising edge or falling edge. The LSB specifies the phase to shrink.<br>i) 2'b11 – Rising Edge-Rising Edge Shrink, Positive Phase Shrink<br>ii) 2'b10 – Rising Edge-Rising Edge Shrink, Negative Phase Shrink<br>iii) 2'b01 – Falling Edge-Falling Edge Shrink, Positive Phase Shrink<br>iv) 2'b00 – Falling Edge-Falling Edge Shrink, Negative Phase Shrink |
| 2 | stop_clk_mode | R/W | 0 | Enables stop clock feature. |
| 1 | shrink_clk_mode | R/W | 0 | Enables shrink clock feature. |
| 0 | csk_en | R/W | 0 | Master enable for the feature, which loads the settings into the csk_fsm and allows the fsm to trigger from a de-assertion of rstpwr or ct_sel. |

FIG. 5A

| Bit(s) | Name | Access | Reset | Description |
|---|---|---|---|---|
| 63:61 | ct_sel | R/W | 0 | One-hot field that enables a test if the ct_recv bus matches this value. |
| 60:6 | reserved | R/W | 0 | Reserved bit field. |
| 5:0 | ap_sel | R/W | 0 | Index of the block to be enabled for the test when this value matches the rst_pwr.ppvid field. |

FIG. 5B

| Bit(s) | Name | Access | Reset | Description |
|---|---|---|---|---|
| 63:0 | shrink_start_index | R/W | 0 | Cycle index to start clock shrink. One should never set this to 0 when the feature is enabled, it can cause extraneous shrinks. |

FIG. 5C

| Bit(s) | Name | Access | Reset | Description |
|---|---|---|---|---|
| 63:0 | shrink_stop_index | R/W | 0 | Cycle index to end the clock shrink. One should never set this to 0 when the feature is enabled, it can cause a stop when not intended. |

FIG. 5D

| Bit(s) | Name | Access | Reset | Description |
|---|---|---|---|---|
| 63:0 | clk_stop_index | R/W | 0 | Cycle index to stop the clock. |

FIG. 5E

| Bit(s) | Name | Access | Reset | Description |
|---|---|---|---|---|
| 63:0 | cycle_count | R/W/H | 0 | Current cycle index sent from FSM cycle counter |

FIG. 5F

| Shrink Settings | Type of Shrink |
|---|---|
| 00 | Falling Edge->Falling Edge, Negative Phase |
| 01 | Falling Edge->Falling Edge, Positive Phase |
| 10 | Rising Edge->Rising Edge, Negative Phase |
| 11 | Rising Edge->Rising Edge, Positive Phase |

FIG. 7A

SYSTEM AND METHOD FOR PERFORMING A FAILURE ASSESSMENT OF AN INTEGRATED CIRCUIT

RELATED APPLICATION

This application claims the benefit of U.S. Provisional Application No. 62/771,466, filed on Nov. 26, 2018. The entire teachings of the above application are incorporated herein by reference.

BACKGROUND

An integrated circuit (IC) may be regarded as a collection of functional building blocks (IC components) distributed across a substrate. Each of the IC components defines a subset of the total integrated electrical elements of the IC. The IC generally includes a set of physical input and output (I/O) contacts that facilitate coupling of the IC components to devices external to the IC.

A series-connected string of IC components may lie between an input contact and an output contact. A data at the input contact may be sequentially processed by the string of IC components. In a clocked system, the data may take multiple clock cycles to progress from the input contact to the output contact. As the data passes through the string of IC components, it is captured in data storage devices (e.g., latches) by the clock signal. During the design and simulation phase of the IC, a circuit designer uses models of the IC components to determine where these storage devices need to occur along the string of IC components. The designer must take care to satisfy certain design timing rules. For example, the worst-case propagation time from one storage device to the next storage device needs to be less than the relevant clock period, to be certain that the data is reliably captured.

Once the design and simulation phase is complete, and the IC design has been verified, the IC is fabricated. Occasionally, characteristics of one or more of the fabricated IC components are different from the corresponding model. When this is the case, the fabricated IC may exhibit a failure by not processing the data correctly due to a timing error at a storage device. For a complex IC design, with many IC components, it may be a tedious and time-consuming effort to determine where the timing issue occurs.

SUMMARY

The described embodiments are directed to system for, and methods of, isolating and characterizing performance failures in integrated circuit hardware. The described embodiments may determine a critical timing path within a block of integrated circuit (IC) components, and extract the contents of the failed block for analysis. By shrinking the clock applied to the circuit components within the block of IC components, thereby inducing timing errors, the described embodiments may determine the specific clock cycle at which the earliest failure occurs. Then, by scanning the register contents after a clock shrink operation on the failed cycle, one can find the cone of logic (i.e., the circuit network as traced from a given output to the associated inputs) that failed timing and modify the design to increase the speed of the chip.

In one aspect, an embodiment of the invention may be a system for performing a failure assessment of an integrated circuit (IC), comprising a hardware subsystem and a control subsystem. The hardware subsystem may be disposed on the IC. The hardware system may be configured to change a duration of one or more cycles of a clocking signal on the IC. The hardware system may be configured to stop the clocking signal at a selected clock cycle of the clocking signal. The control subsystem may be configured to control the hardware subsystem to perform operations of (i) change the duration of one or more selected clock cycles of the clocking signal across a search block of clock cycles, (ii) perform a binary search across the search block of clock cycles, such that the selected clock cycles having a changed duration are temporally placed at selected different locations within the search block of clock cycles, (iii) at each iteration of the binary search, determine when a failure occurs, (iv) when the binary search indicates a single clock cycle associated with the failure, stop transitions of the clocking signal at the single clock cycle, and (v) extract data from one or more circuit components of the IC.

The control subsystem may comprise a processor and a memory with computer code instructions stored thereon. The memory may be operatively coupled to the processor such that, when executed by the processor, the computer code instructions cause the system to implement the operations performed by the hardware subsystem.

The failure may be determined by an evaluation of a data vector produced by the IC. The evaluation may comprise a comparison of the data vector to an expected data vector.

The hardware subsystem may further comprise a clock shrink logic module and a clock stop logic module. The clock shrink logic module may comprising (i) a clock multiplexer select submodule configured to generate a select signal, (ii) a clock multiplexer configured to generate a shrink clock, (iii) an odd/even state machine configured to generate one or more control signals for the clock multiplexer select submodule, and (iv) an input register submodule configured to supply control parameters to the clock multiplexer select submodule.

The clock multiplexer, based on the select signal, may select one of a primary clock signal and a delayed version of the primary clock signal to generate the shrink clock signal.

The search block of clock cycles may be established with a start index and a stop index. One of the start index and the stop index may be moved to a midpoint of the search block of clock cycles following an iteration of the binary search, based on where the failure occurred within the search block of clock cycles.

The one or more clock cycles undergoing a change of duration may occur every other clock cycle of the clocking signal. The one or more clock cycles undergoing a change of duration may occur in either even positions or odd positions of the search block. Each iteration of the binary search may produce a block with clock cycles undergoing a change of duration in even positions, followed by a block with clock cycles undergoing a change of duration in odd positions. The binary search may maintain the start index as either the even position or the odd position throughout the iterations of the binary search.

The control subsystem may control the hardware subsystem by writing control information to at least one control and status register (CSR).

In another aspect, an embodiment of the invention may be a method of performing a failure assessment of an integrated circuit (IC), comprising a control subsystem cooperating with a hardware subsystem to perform the steps of (i) changing a duration of one or more selected clock cycles of a clocking signal across a search block of clock cycles, (ii) performing a binary search across the search block of clock cycles, such that the selected clock cycles having a changed duration are temporally placed at selected different locations within the search block of clock cycles, (iii) at each iteration of the binary search, determining when a failure occurs, (iv) when the binary search indicates a single clock cycle associated with the failure, stopping transitions of the clocking signal at the single clock cycle, and (v) extracting data from one or more circuit components of the IC.

The control subsystem cooperating with the hardware subsystem may comprise a processor operatively coupled to a memory with computer code instructions stored thereon such that, when executed by the processor, the computer code instructions cause the recited steps to be performed.

The method may further comprise selecting, based on a select signal, one of a primary clock signal and a delayed version of the primary clock signal to generate the shrink clock signal. The method may further comprise establishing a search block of clock cycles with a start index and a stop index. One of the start index and the stop index may be moved to a midpoint of the search block of clock cycles following an iteration of the binary search, based on where the failure occurred within the search block of clock cycles.

The method may further cause the one or more clock cycles undergoing a change of duration to occur every other clock cycle of the clocking signal. The one or more clock cycles undergoing a change of duration may occur in one of even positions and odd positions.

The method may further cause each iteration of the binary search to produce a block with clock cycles undergoing a change of duration in even positions, followed by a block with clock cycles undergoing a change of duration in odd positions. The method may further cause the binary search to maintain the start index as one of the even position and the odd position throughout the iterations of the binary search. The method may further cause the data to be extracted from one or more circuit components of the IC through a scan chain of one or more circuit components of the IC. The method may further comprise controlling the hardware system by writing control information to at least one control and status register (CSR).

Changing the duration of the one or more selected clock cycles of the clocking signal further comprises one of (i) shortening the one or more selected clock cycles from rising edge to rising edge by shortening the positive phase, (ii) shortening the one or more selected clock cycles from rising edge to rising edge by shortening the negative phase, (iii) shortening the one or more selected clock cycles from falling edge to falling edge by shortening the positive phase, and (iv) shortening the one or more selected clock cycles from falling edge to falling edge by shortening the negative phase.

BRIEF DESCRIPTION OF THE DRAWINGS

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 1B shows example parameters, supplied by a user and employed by the IC failure assessment system, to tailor operation of the failure assessment.

FIG. 1C shows example results returned from the IC failure assessment system and provided to the user.

FIGS. 3A through 3D illustrate a pseudocode example of the clock shrink procedure according to the invention.

FIG. 4 illustrates an example procedure for stopping the clocking signal according to the invention.

FIGS. 5A through 5F illustrate example CSR fields according to the invention.

FIG. 7A shows an example set of clock shrink options according to the invention.

DETAILED DESCRIPTION

A description of example embodiments follows.

The teachings of all patents, published applications and references cited herein are incorporated by reference in their entirety.

The described embodiments of the invention are directed to systems for, and methods of, introducing timing errors within a block of integrated circuit (IC) hardware, to induce one or more failure modes. Once a failure mode is manifested, the described embodiments may isolate the failure mode to the particular clock cycle that causes the failure. When the failure-producing clock cycle has been identified, the clocking may be halted, and data stored by the failure-producing clock cycle may be extracted for analysis.

The described embodiments may perform the failure assessment in two phases. In a first phase, a clock signal provided to the circuit block may be manipulated (e.g., shrunk—resulting in a reduced clock cycle) to determine an earliest fail cycle of the clock (if one exists). A fail cycle may be indicated by, for example, detecting an error in a data vector produced by the IC by comparing the data vector produced by the IC to an expected data vector value based on a known input/output test data vector pair. In a second phase, the clock may be stopped on the determined failed clock cycle, and a scan dump may be performed on the circuit components associated with the failed clock cycle.

The example embodiment herein present hardware circuit components and associated procedures for implementing a failure assessment procedure to identify a source of a failure of the IC's functionality. The failure assessment procedure may utilize a binary search procedure that executes a clocking run across a block of clock cycles. At the end of each clocking run of the binary search procedure, the IC outputs are evaluated to determine if a failure occurred. The binary search procedure then iteratively halves the block of clock cycles to isolate the error-inducing clock cycle to an increasingly smaller block of clock cycles, until the failure is narrowed to a single clock cycle. The clock is stopped at the failure-inducing clock cycle, and data is extracted from the IC to evaluate the cause of the failure.

The binary search procedure cooperates with two other procedures as part of the failure assessment procedure. A clock shrink procedure is used to shorten selected clock cycles to induce a failure by stressing timing paths within the IC. A clock stop procedure is used to stop the clock once the failure inducing clock cycle has been identified.

Figure 1A:
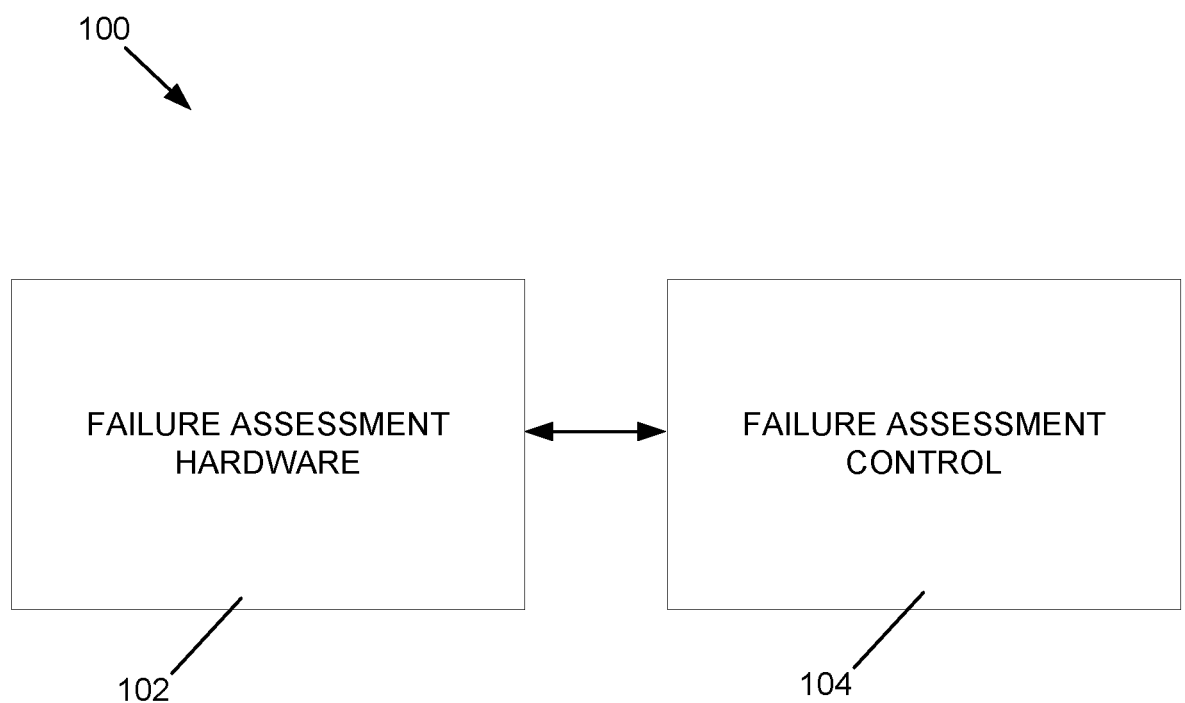
FIG. 1A illustrates an example embodiment of an IC failure assessment system according to the invention.

FIG. 1A illustrates an example embodiment of an IC failure assessment system 100 according to an embodiment of the invention. The example IC failure assessment system 100 comprises a failure assessment hardware subsystem 102, disposed on the IC, and a failure assessment control subsystem 104. In the example embodiment, the failure assessment control subsystem 104 comprises a processing system configured to execute instruction code (e.g., software, firmware, among others) to implement the embodiments described herein. In alternative embodiments, the control subsystem 104 may comprise solely hardware, or a combination of non-processor hardware and instruction code.

As described herein, an example embodiment of the hardware subsystem 102 may comprise a "rest of chip" (ROC) subsystem, a "processor core logic (PCL) subsystem, a misc. routing channel (MRC) subsystem and a DRAM controller partition (DCP1) subsystem, although in alternative embodiments the hardware subsystem 102 may comprise other hardware components instead of or in addition to the subsystems described herein.

An example embodiment of an IC failure assessment system may accept certain parameters from a user, set forth in FIG. 1B, to tailor operation of the failure assessment procedure. The example embodiments may return certain results to the user, as set forth in FIG. 1C.

To determine the earliest fail cycle (i.e., a clock cycle that produces a failure mode), the described embodiments may perform a binary search in conjunction with clock manipulation (e.g., varying clock period and duty cycle). An example embodiment may sort through the clock cycles within designated search bounds, and determine the earliest cycle to fail timing if an error is found. The example embodiment may accomplish this by shrinking the clock within subsections of the search bounds, and then checking if any logic assertions failed. Since a logic check to identify a failure event is only available when a test run concludes, multiple runs may be executed to run a binary search through the subsection start and stop indices. Thus, on each test run, the binary search is used to determine the start and stop indices of a clocking subsection, and to determine if that subsection of the search causes a timing failure. Eventually, the example embodiment narrows the subsection to one failing clock cycle, and returns that value as the earliest clock cycle number.

Figure 2:
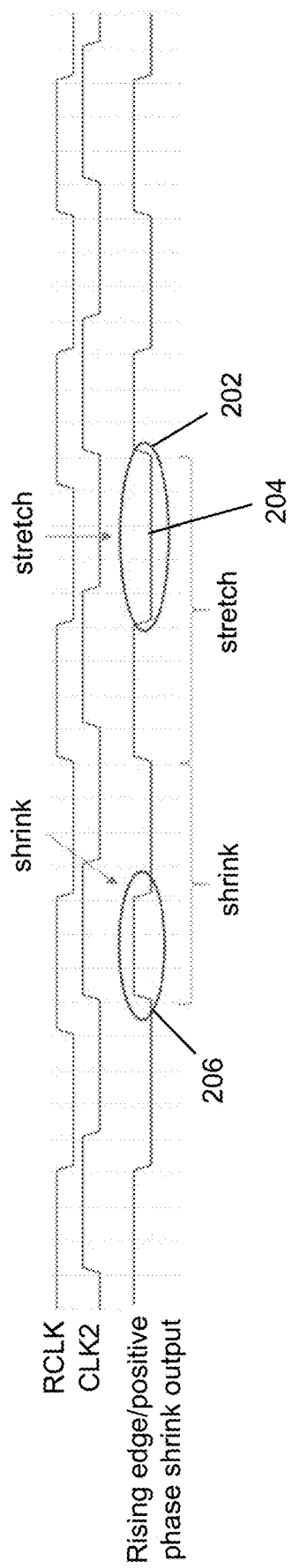
FIG. 2 shoes an example clock shrink operation according to the invention.

Ideally, the clock would be shortened every cycle in each subsection. This is not possible, however, without shrinking unselected edge-to-edge paths and phases. Accordingly, for the described embodiments of the binary search, shortening of the clock cycles occurs every other cycle. This allows the clock to stretch 202 on the low portion 204 of the cycle, as shown in FIG. 2, and only shrink 206 the clock on one edge-to-edge path and phase. As a result, the binary search is run twice, on even and odd cycles, to fully encompass the specified search bounds, i.e., shrink_start_index to shrink_stop_index in the example embodiment.

An example embodiment of a clock shrink procedure associated with the failure assessment system according to the invention may execute a test run (i.e., a run of clock cycles of the IC between predetermined start and stop times) that shrinks the odd clock cycles (i.e., clock cycles 1, 3, 5, 7, etc., beginning at the predetermined start time) between the search bounds. If a timing error is indicated, a binary search over the odd cycles is executed to find the earliest failed cycle. Next, the same procedure is run for the even cycles in the search bounds. If both odd and even binary searches produce an earliest fail cycle, the minimum cycle number of the two search runs is chosen.

The binary search procedure uses a basic binary search structure, modified for the even and odd clock runs, and optimized for preferences in the lower half (i.e., in the latter half of the clock run) of the search bounds. The binary search procedure consists of a loop that includes a shrinking the even or odd cycles, where even and odd cycles are determined by the initial start index, of the first half of the current search bounds subsection. The failure assessment system then checks if a failure occurred in the lower half of the subsection. If a failure is found, the subsection end is set to the first subsection midpoint and the same procedure is run in the next iteration of the procedure. It is important to note that if the test fails in the first half, it is not necessary to rerun for the lower half, as the goal is to find the earliest fail cycle. If an error is not found in the tested lower half, however, the midpoint will become the new subsection start while the end bound remains constant. This binary search loop will continue to run until there are two possible fail cycles within the bounds. One final test is then run with the earliest cycle location and if an error occurs, the earliest fail location is set to the first cycle number, else it is set to the other value.

When implementing the binary search procedure, the subsection start bound should stay even or odd throughout the binary search algorithm—otherwise the test may not perform properly. The shrink logic used to implement the test is designed to shrink every other cycle, starting from the shrink start index, which means that the procedure should maintain this polarity during the binary search procedure. A pseudocode example of the clock shrink procedure is shown in FIGS. 3A through 3D.

Once the earliest fail cycle is determined from the binary search procedure, one final test may be run to shrink the clock on that failure-inducing cycle. Immediately after the shrink occurs, the clock may be stopped, thereby preserving the register contents generated by the error cycle. The register states may then be scanned out by executing a scan dump, i.e., the register states may be extracted serially through a scan chain, as is known in the art.

To stop the clock immediately after the shrink occurs, several settings must be changed to accommodate the difference in the shrink/stop clock enable paths. In an example embodiment, the stop clock enable is delayed by two clock cycles, in comparison to the shrink clock enable, so in an example embodiment the clock_stop_index is set to shrink_stop_index+2. This delay value is an example for this description, may change with alternative embodiments. The procedure for stopping the clock is further described in FIG. 4.

An example embodiment may utilize a set of control and status registers (CSRs), for use by a failure assessment control subsystem, to set various parameters of the failure assessment procedure described herein. The failure assessment control subsystem may be implemented in software, hardware, or a combination both. The example CSRs may comprise:

1. csr_csk_ctl_reg—This register contains all the necessary signals to control the finite state machine (FSM) inside the misc. routing channel (MRC). See FIG. 5A for an example of the fields contained within this CSR.
2. cskap_select—This register is used to select which block is enabled during the test. See FIG. 5B for an example of the fields contained within this CSR.
3. shrink_start_index—This register is used to control the lower shrink bound. See FIG. 5C for an example of the fields contained within this CSR.
4. shrink_stop_index—This register is used to control the upper shrink bound. See FIG. 5D for an example of the fields contained within this CSR.
5. clk_stop_index—This register is used to control the cycle on which the clock will be stopped. See FIG. 5E for an example of the fields contained within this CSR.
6. cycle_count—This is a read only register, which is used as feedback for the failure assessment procedure. See FIG. 5F for an example of the fields contained within this CSR.

Figure 6A:
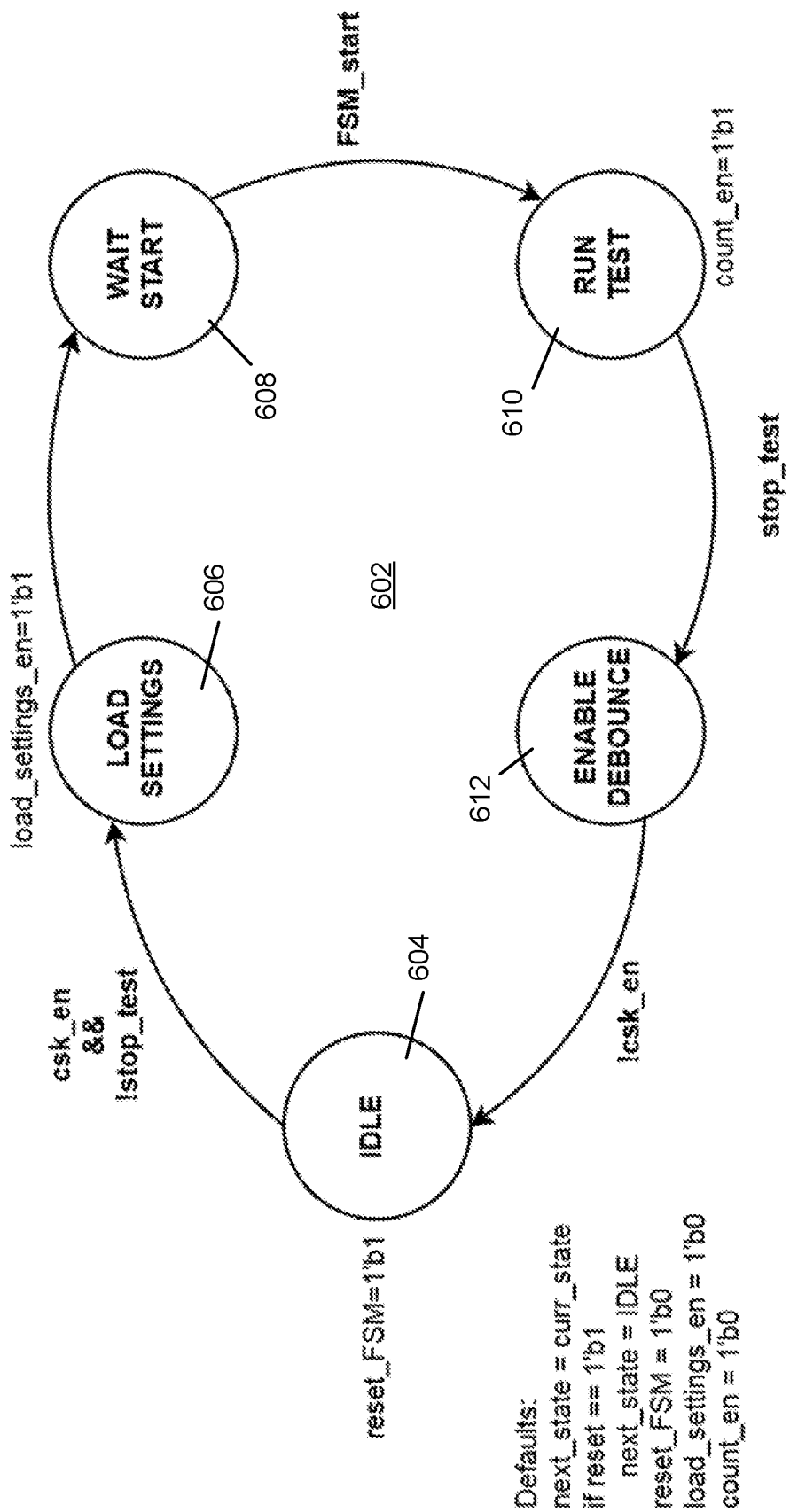
FIG. 6A shows a state diagram of an example embodiment of a finite state machine (FSM) according to the invention.

A state diagram of an example embodiment of a finite state machine (FSM) 602 is shown in FIG. 6A. The example embodiment employs the finite state machine 602 to control the clock shrink and stop procedures described herein. The FSM 602 uses the settings stored in the CSRs to navigate the allowed FSM states. The FSM 602 requires the failure assessment procedure to set CSR fields in a certain order, as described herein, and demonstrated in the example pseudo-code of FIGS. 3A through 3F and FIG. 4.

The example FSM 602 contains five states, comprising IDLE 604, LOAD_SETTINGS 606, WAIT_START 608, RUN_TEST 610, and ENABLE_DEBOUNCE 612. Within IDLE, the FSM is constantly reset, and the signals sent to the RCLK post-PLL controller (RPPC) in the dynamic RAM controller partition (DCP1) are tied to logical zero (0). After the field csk_en is set, the FSM transitions to the LOAD_SETTINGS state 606 and samples the CSR registers to be used for the test: shrink_start_index, shrink_stop_index, clk_stop_index, shrink_clk_mode, stop_clk_mode, shrink_settings, and delay_settings. Thus, the settings must be stable and initialized before csk_en is set, which also means that the settings can't be changed during a test run. After LOAD_SETTINGS 606, the FSM transitions to the WAIT_START state 608, which waits for the specified block to come out of reset. After the FSM receives the start trigger, which is a function of rstpwr, ap_select, and ct_sel, as set forth in Equation (1) below, the FSM enters the RUN_TEST state 610, which enables the cycle counter and will continue to run until the stop_count CSR field is set by software:

$$FSM\_start = (ct\_sel == 3'b000) ? (rst\_pwr.valid$$

$$\&\&!rst\_pwr.rst$$

$$\&\&(rst\_pwr.ppvid == ap\_sel))$$

$$:(ct\_sel == ct\_recv); \quad \text{Equation (1)}$$

The parameters ct_sel and ap_select are set forth in FIG. 5B. The parameters rst_pwr.valid, rst_pwr.rst and ct_recv are signals generated by the Block management CSRs (not shown). They indicate when a specific block has transitions out of a reset condition and the counting activities can proceed. The parameter rst_pwr.valid indicates that power is applied to the relevant block. The parameter rst_pwr.rst indicates an application of a reset to a block collection (i.e., a group of blocks). The parameter ct_recv are debugging bits used as triggers. In general, these bits may be connected, through a debug MUX, to any signals in the IC block(s). In the described embodiments, the ct_recv bits are used to match a specific trigger to enable the FSM.

Figure 6B:
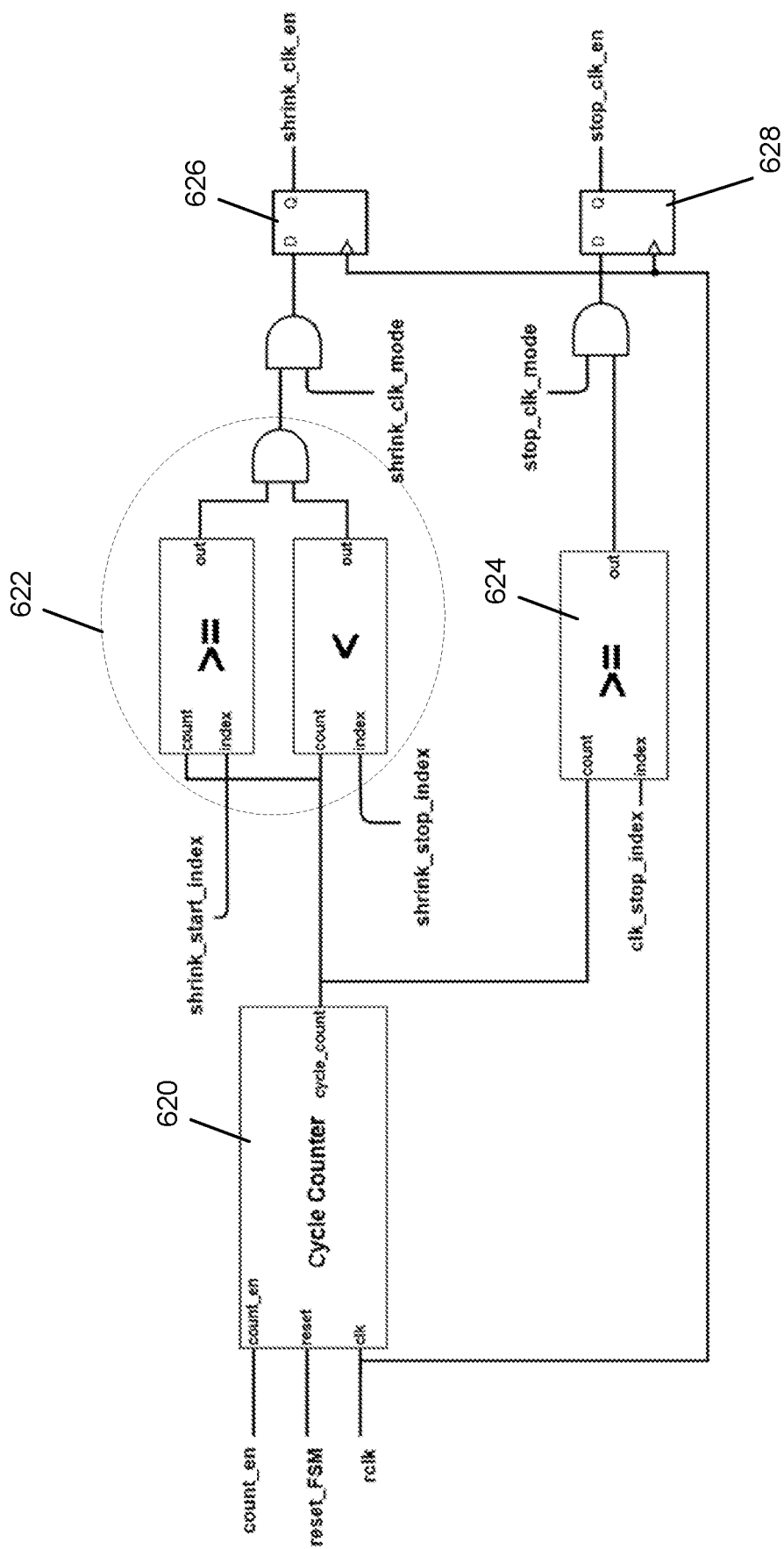
FIG. 6B illustrates an example FSM controller according to the invention.

The example embodiment includes a debounce state for the enable to allow the FSM to be reset manually. An example datapath implementation for the FSM controller in shown in FIG. 6B, which demonstrates how the shrink and stop clock enables are generated and reset via the FSM control signals. Cycle Counter 620, which is enabled by count_en and reset to an initial state by reset_FSM, is incremented by each cycle of rclk. The output of Cycle Counter 620 (cycle_count) indicates the current number of rclk cycles counted. A shrink clock comparator 622 and a stop clock comparator 624 receive cycle_count. The shrink clock comparator 622 outputs a logic true when cycle_count is greater than or equal to shrink_start_index AND less than shrink_stop_index. The logic true value is passed to the shrink clock register 626 when shrink_clk_mode is true, and passed through the shrink clock register 626 as shrink_clk_en upon the next cycle of rclk. The stop clock comparator 624 outputs a logic true when cycle_count is greater than or equal to clk_stop_index. The logic true value is passed to the clock stop register 628 when stop_clk_mode, and passed through the clock stop register 628 upon the next cycle of rclk.

The FSM 602 is triggered via the 3 bit one-hot ct_recv bus and the rst_pwr struct. Preference is given to the one-hot ct_recv bus, which triggers the FSM if it matches the CSR field, ct_sel. However, if the ct_recv bus is cleared, the rst_pwr bus is used to trigger the start of the FSM 602 if the rst_pwr.ppvid field is equal to the CSR field ap_sel. The logic is described in Equation 1, above. The rst_pwr.ppvid field is an identifier used to select which block of IC components is under test for the shrink procedure. Even though all the blocks of the IC may be affected, only one, identified by the rst_pwr.ppvid field, will define how the counter trigger is derived.

Upon completion of the binary search, when the clocking has ceased, the FSM sets the stop_test field of the csr_csk_ctl_reg CSR, which provides an indication to external components that the failure assessment procedure has completed.

Example Clock Shrink Procedure Implementation

An example embodiment may utilize two parameters associated with shrinking the clock, one being the edge-toedge time, and the other being the phase of the clock. As used herein, the phase of the clock refers to the "high" and "low" portions of the clock signal. The parameters may define four options, depicted in the shrink settings table of FIG. 7A, and in the waveform diagram of FIG. 7B. Using the parameters to implement particular types of shrink allows the user to select the type of critical path to stress, which also helps narrow down the responsible path in a failing cone of logic.

Figure 7B:
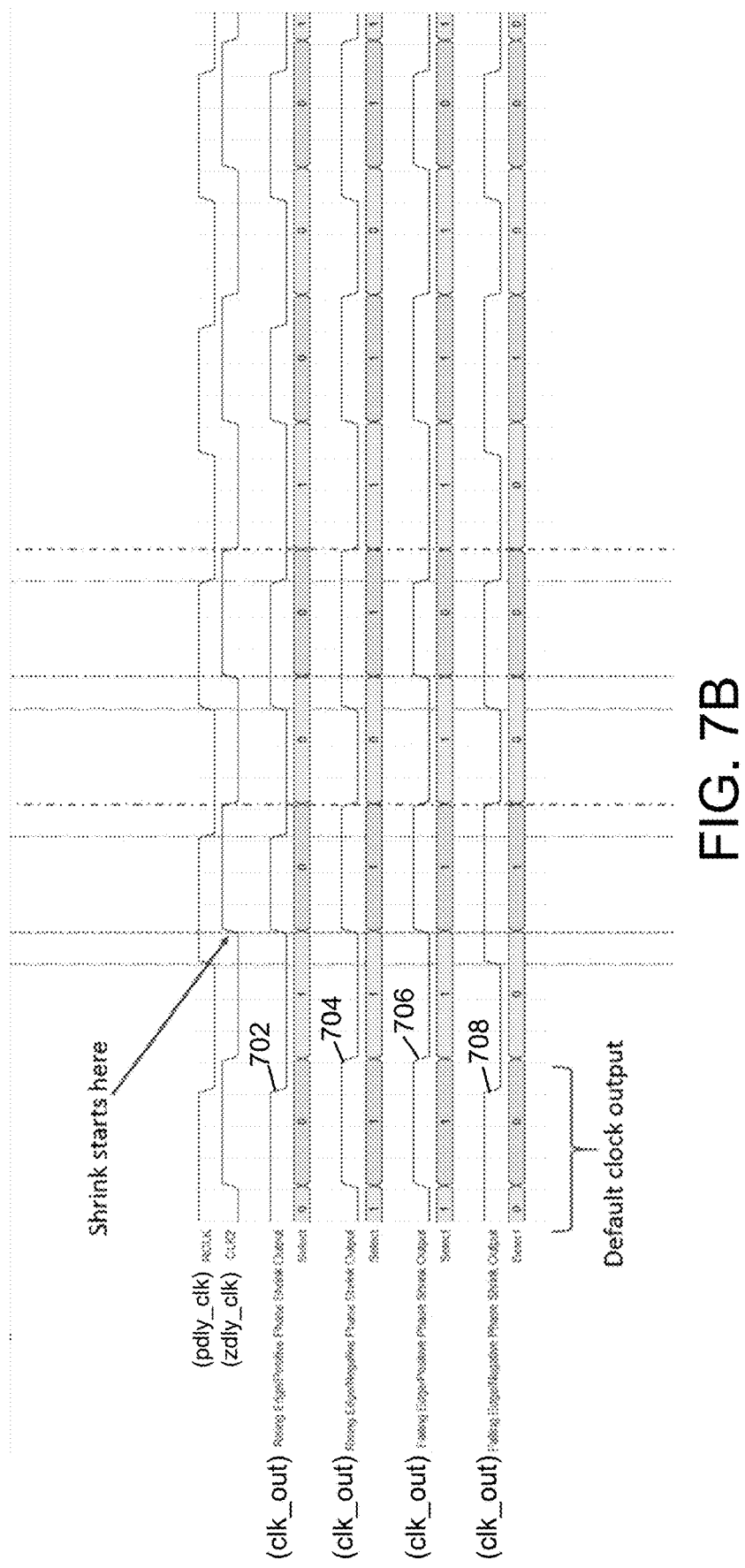
FIG. 7B shows an example waveform diagram that illustrates the clock shrink options depicted in FIG. 7A.

The waveform diagram of FIG. 7B demonstrates the timing of each shrink method variation when shrinking on every other cycle. As one can see, the shrink settings will change the timing of the clock edges as well as the default clock output before the shrink has been started, which is necessary to not introduce an extraneous shrink when the feature is enabled or disabled.

Shrink waveform 702 is an example of a rising edge/positive phase shrink output, for which the cycle is shortened from rising edge to rising edge, by shrinking the high portion of the cycle (positive phase).

Shrink waveform 704 is an example of a rising edge/negative phase shrink output, for which the cycle is shortened from rising edge to rising edge, by shrinking the low portion of the cycle (negative phase).

Shrink waveform 706 is an example of a falling edge/positive phase shrink output, for which the cycle is shortened from falling edge to falling edge, by shrinking the high portion of the cycle (positive phase).

Shrink waveform 704 is an example of a falling edge/negative phase shrink output, for which the cycle is shortened from falling edge to falling edge, by shrinking the low portion of the cycle (negative phase).

Example Clock Shrink Procedure Implementation

Figure 8A:
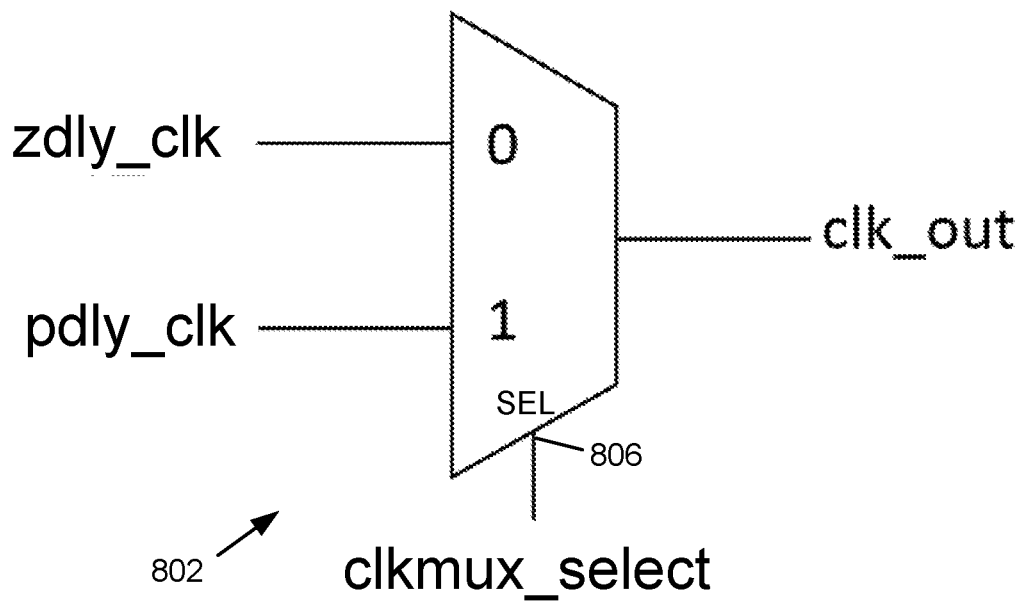
FIG. 8A shows an example multiplexer for use in clock shrink operations according to the invention.
Figure 8B:
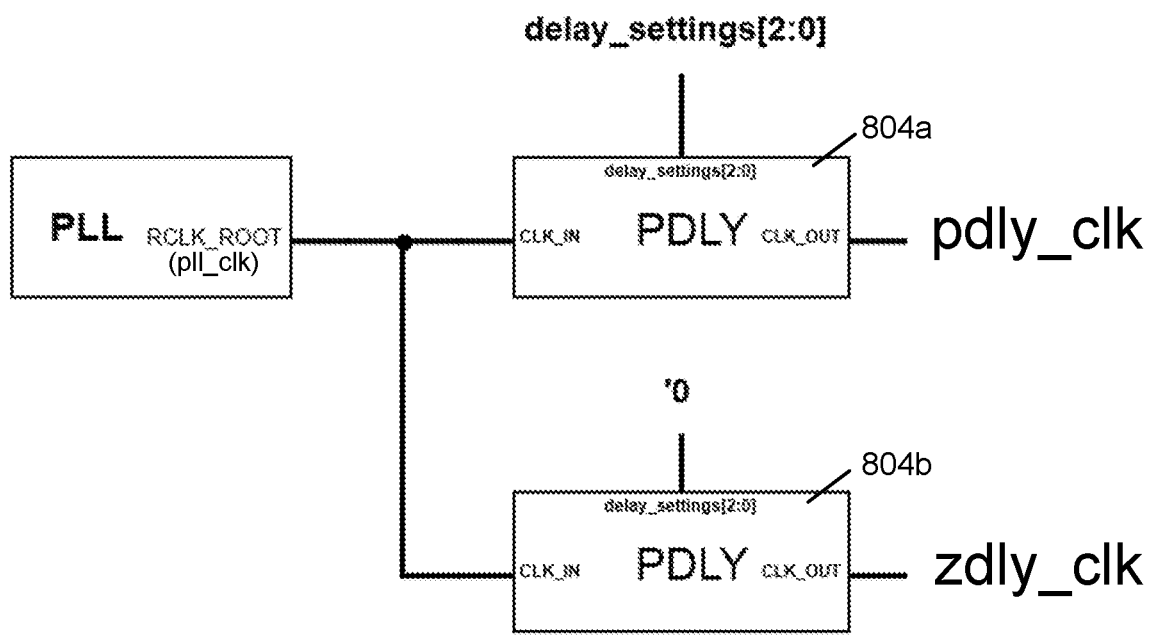
FIG. 8B illustrates example delay modules for generating the clocks used by the multiplexer shown in FIG. 8A.
Figure 9:
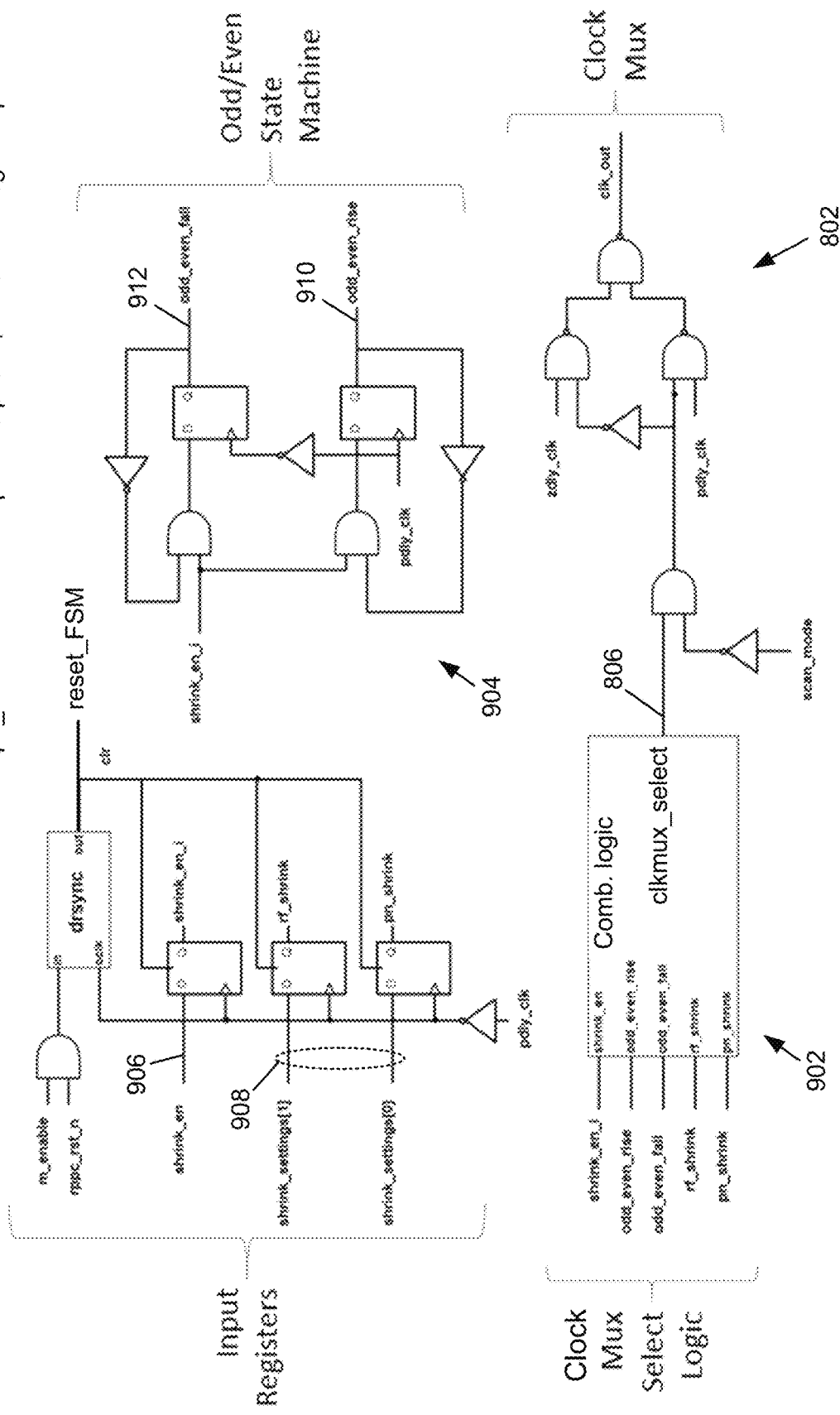
FIG. 9 illustrates example components used for clock shrink operations according to the invention.

An example embodiment of a logic module configured to implement a clock shrink procedure is depicted in FIGS. 8A, 8B, and 9. An example embodiment utilizes a 2-to-1 multiplexer (Mux) 802, as shown in FIG. 8A, with the root clock, zdly_clk (referred to as RCLK in FIG. 7B, and a delayed version of the root clock, pdly_clk (CLK2 in FIG. 7B), as inputs. By changing the select input 806 for the mux using clkmux_select, different clock edges (e.g., delayed or non-delayed) may be chosen to create the various shrink waveforms depicted in FIG. 7B.

The clock inputs (i.e., zdly_clk, pdly_clk) to the Mux 802 are generated using programmable delay modules (PDLY) 804a, 804b, as shown in FIG. 8B, to selectively delay a source clock RCLK_ROOT. The PDLY module 804a is selectively configured to exhibit a particular delay based on the delay_settings[2:0] input (which is provided by the clock_delay_select field of the csr_ctl_reg CSR), while the PDLY 804b is configured to exhibit a minimum delay of the PDLY module, thereby producing a desired offset delay between zdly_clk and pdly_clk. The delay module 804b is included so that zdly_clk and pdly_clk can have equal delay with respect to the input RCLK_ROOT. When both module 804a and 804b are provided with the delay_settings of '0, which designates zero delay between pdly_clk and zdly_clk, both modules exhibit the same delay (e.g., a minimum delay). For this example embodiment, the delay settings select up to eight taps of coarse delay, which can give a maximum clock delay of 70 ps. Alternative embodiments may provide other amounts of total delay and delay resolution.

Figure 10:
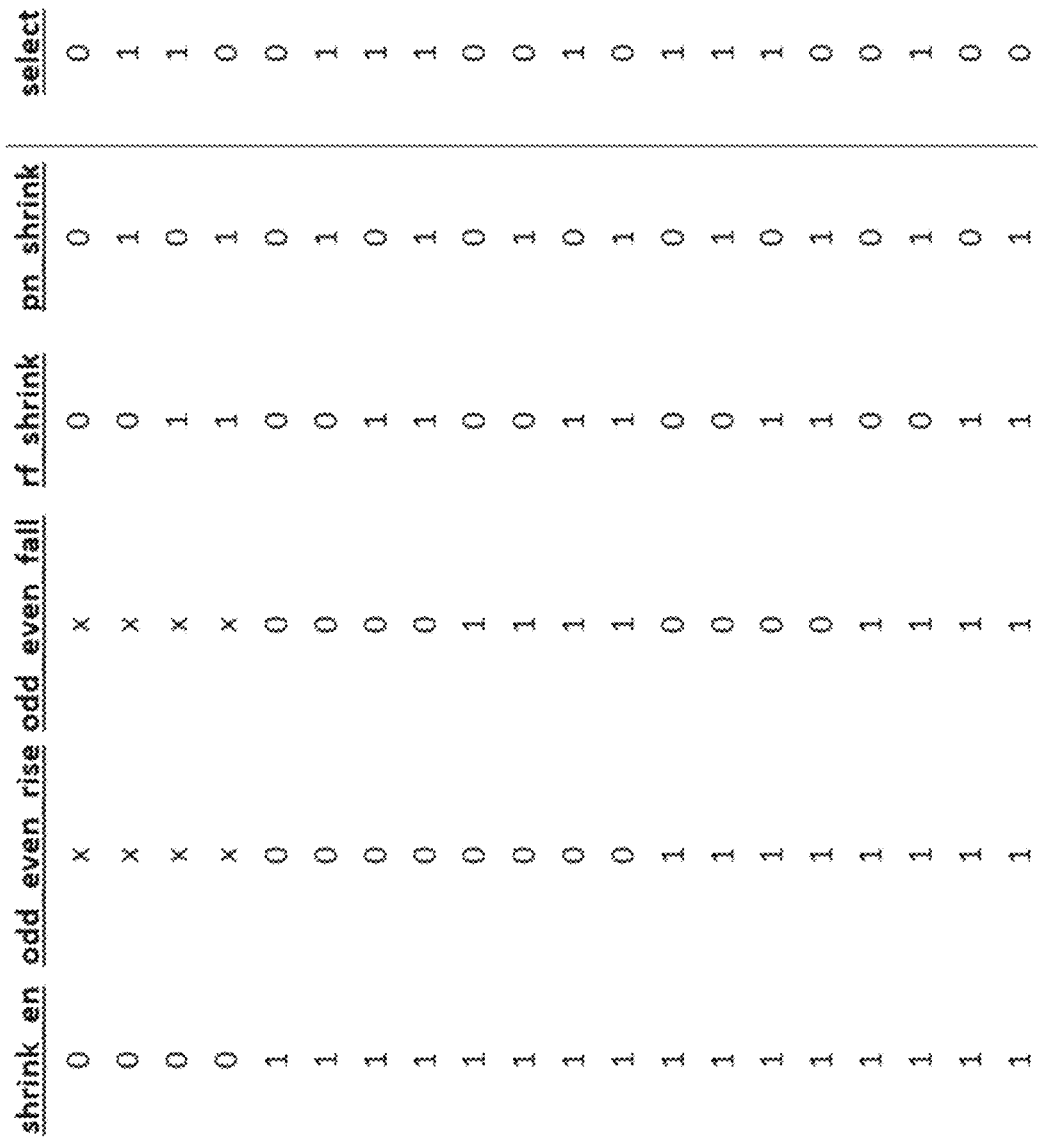
FIG. 10 shows an example combinational logic truth table for generating an enable control signal for the clock multiplexer according to the invention.

Mux select logic components 902, shown in FIG. 9, may be configured to generate the select input 806 for the clock mux 802 to produce a shrink on the root clock (RCLK) every other cycle when enabled. Using combinational logic with the shrink_en control signal 906, shrink_settings[$d_1$, $d_0$] 908, and toggle bits odd_even_rise 910 and odd_even_fall 912 (generated by the odd/even state machine 904) as inputs, a select input clkmux_select 806 is generated. The combinational logic truth table is shown in FIG. 10. The logic equation used to generate the select input clkmux_select 806 is given as follows:

clkmux_select=(!odd_even_rise AND rf_shrink AND !pn_shrink) OR (odd_even_rise AND !rf_shrink AND pn_shrink) OR (!shrink_en AND !rf_shrink AND pn_shrink) OR (!shrink_en AND rf_shrink AND !pn_shrink) OR (shrink_en AND !odd_even_rise AND !odd_even_fall AND pn_shrink) OR (shrink_en AND odd_even_rise AND !odd_even_fall AND !pn_shrink)

Figure 11:
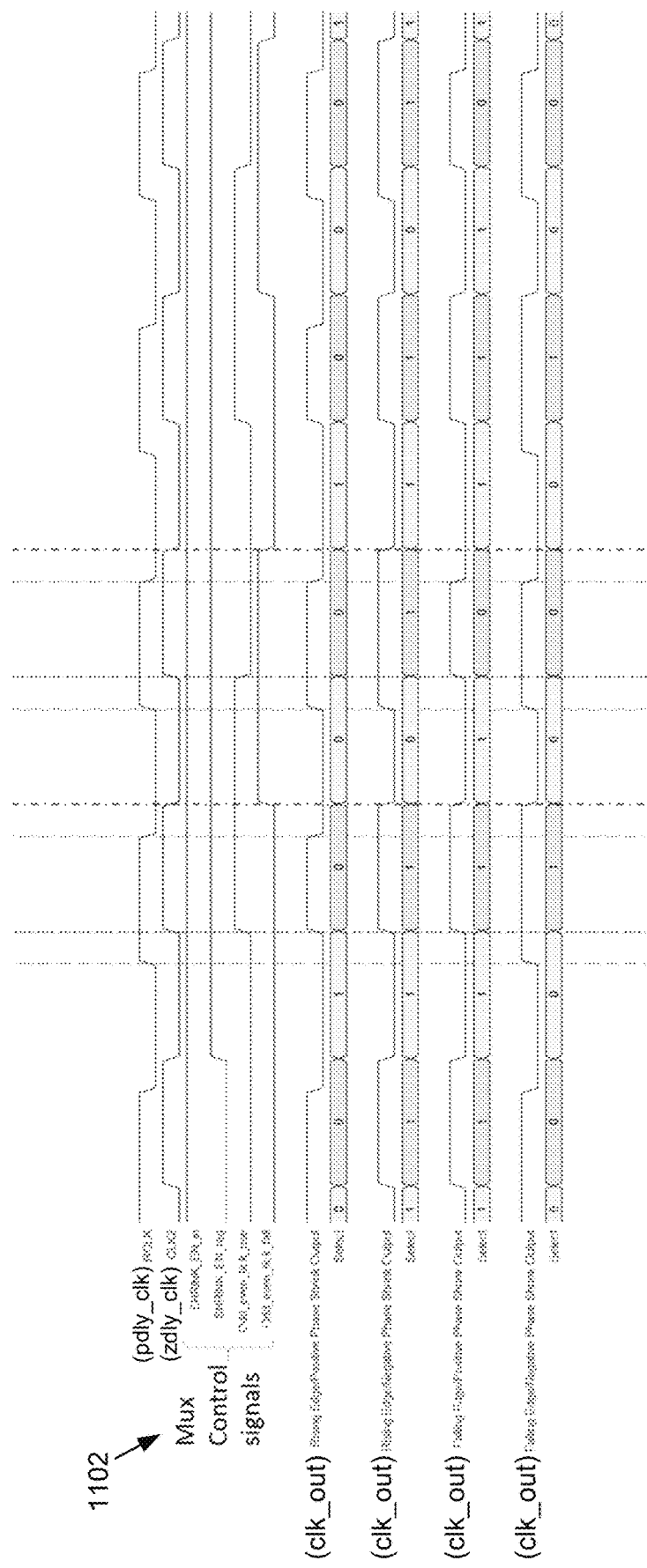
FIG. 11 shows an example of a modified version of the waveform diagram of FIG. 7B, updated with select generation control signals according to the invention.

Additionally, the select input clkmux_select 806 may be clamped to logic zero to bypass the clock shrink logic via several control bits: m_enable, rppc_rst_n, and scan_mode. The control bit m_enable is the master enable (csk_en) set from the csr_csk_ctl_reg CSR, which allows the clock shrink feature to be disabled when it is not being used. The control bit rppc_rst_n is a delayed version of pll_sel[1] by many cycles of refclk, which disables the mux select logic until it is guaranteed that there were enough valid clocks to reset the CSRs and propagate the default values across the chip. Finally, scan_mode selects the zdly_clk mux input when there is a valid scan clock, which allows the scan clock pulses to propagate through the logic with minimal delay. The example timing diagram of FIG. 7B, updated with the select generation signals 1102 described above, is presented in FIG. 11.

Figure 12:
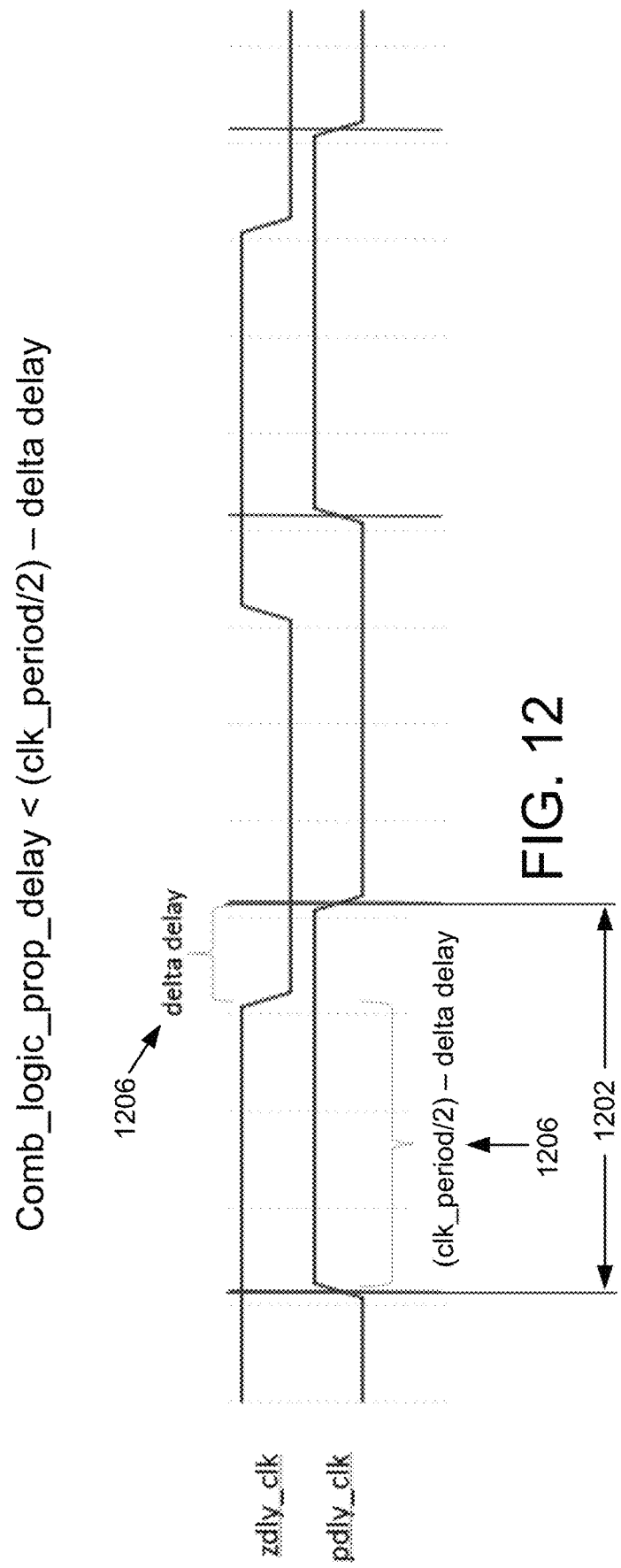
FIG. 12 shows an example timing condition for a glitch-free multiplexer select signal according to the invention.

This mux select logic 902 may be configured to be glitch-free by ensuring that the mux select input 806 only changes when zdly_clk and pdly_clk have the same polarity. This glitch-free condition may be facilitated through several mechanisms. First, scan_mode only toggles when the root clk is at logic zero, which ensures mux switching with both zdly_clk and pdly_clk at logic zero. Additionally, m_enable, shrink_settings, and delay_settings are sampled by the FSM 602, which ensures that those control bits will not change throughout the duration of a test. Finally, shrink_en is clocked with the pdly_clk, which ensures that the combinational logic switches when both clocks are the same phase. The mux select logic 902 will produce a glitch-free mux select input 806, provided the propagation delay through the combinational logic of the mux select logic 902 is less than half 1202 of the poly_clk period minus a delta delay 1204, i.e., comb_logic_prop_delay<(clk_period/2−delta delay) 1206. This condition is shown graphically in FIG. 12.

Example Clock Stop Logic Module Implementation

Figure 13:
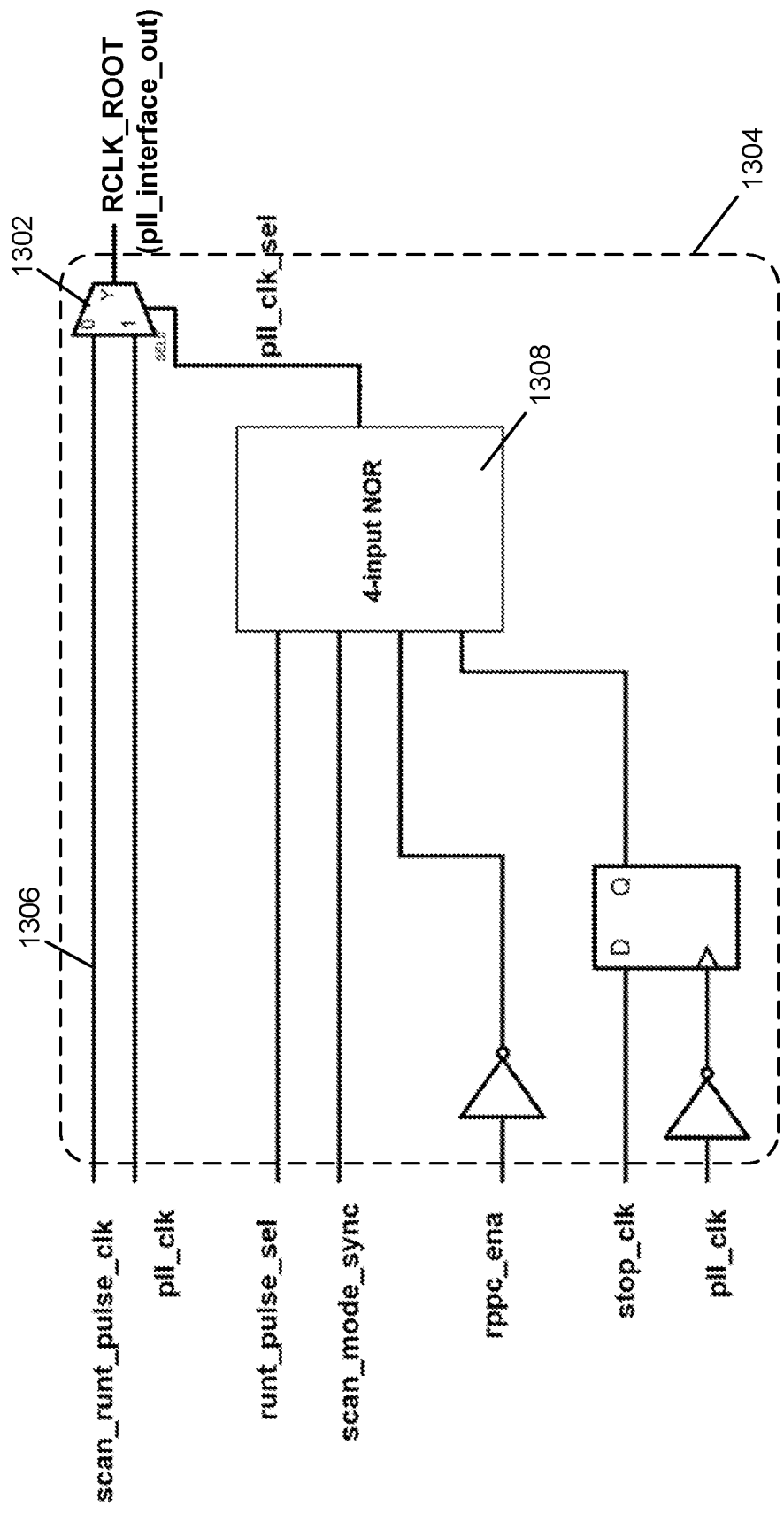
FIG. 13 shows an example logic embodiment for stopping the clock according to the invention.

An example embodiment for stopping the clock (Stop Clock logic module) makes use of the phase-locked loop (PLL) clock (pll_clk) and the scan/runt pulse clock multiplexer 1302 in a PLL interface 1304, as shown in FIG. 13. The 4-input NOR device 1308 causes pll_clk to be selected as RCLK_ROOT only when runt_pulse_sel, scan_mode_sync, and stop_clk are not asserted, and rppc_ena is asserted. When any of runt_pulse_sel, scan_mode_sync, or stop_clk is asserted, or rppc_ena is not asserted, scan_runt_pulse_clk is selected as RCLK_ROOT. By selecting the scan_runt_pulse_clk leg when stop_clk is asserted, the output RCLK_ROOT is driven to zero (because scan_runt_pulse_clk is held at logic zero when a scan operation is not being executed), and thus stops RCLK_ROOT (pll_interface_out). This also allows the scan clock (scan_runt_pulse_clk) 1306 to propagate through the PLL interface 1304 when the scan dump is initialized to extract the register contents.

Note that for the example Stop Clock implementation to function, the enable strap, rppc_ena, (described in more detail in the Routing section herein) should be set to logic high. As mentioned previously, the example stop clock implementation is configured so that a chip reset must be performed to start another test or return to normal operation.

Routing

Figure 14:
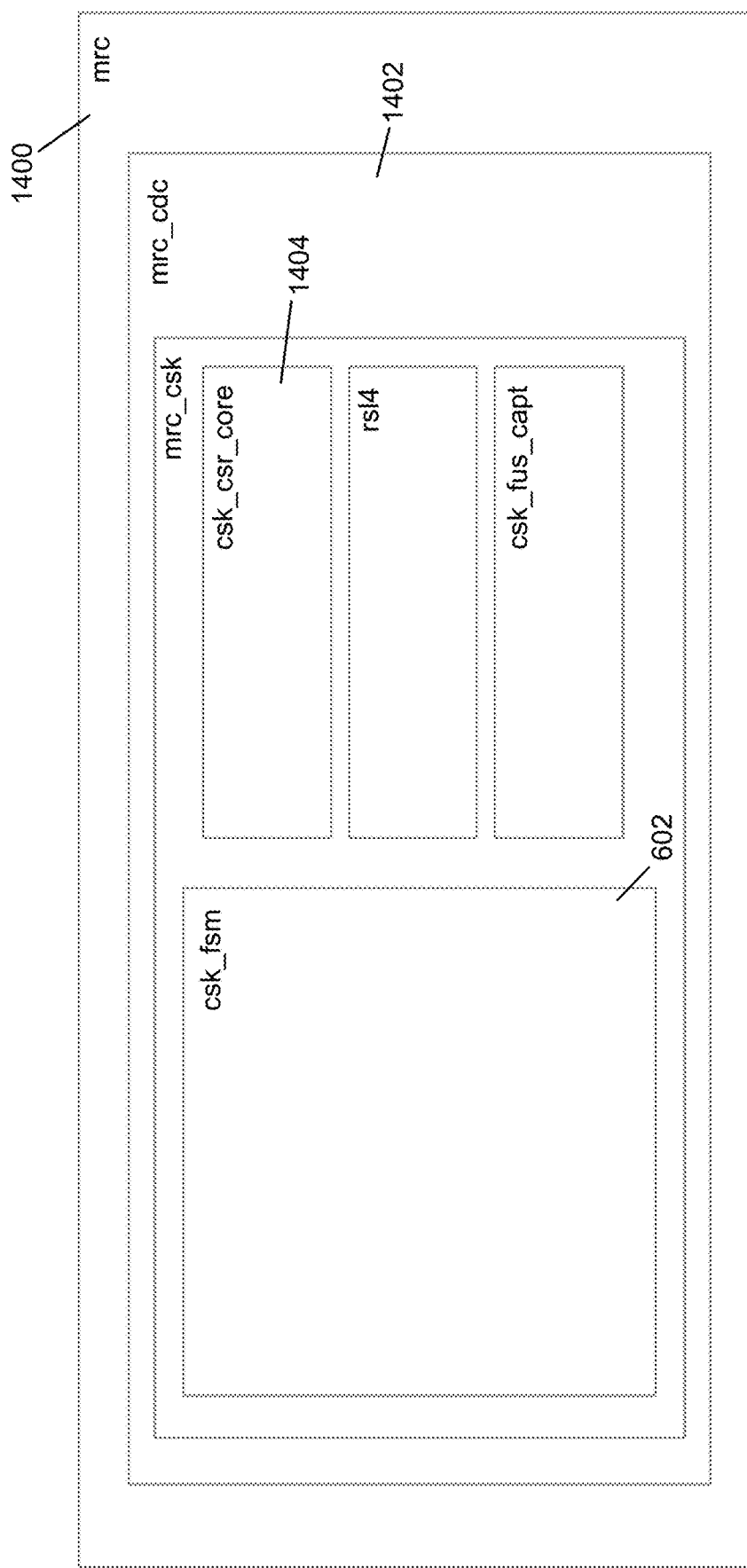
FIG. 14 shows an expanded hierarchy for a routing channel according to the invention.

The hardware circuit components of the example embodiments may be partitioned into two sub-systems: a misc. routing channel (MRC) subsystem 1400 and a DRAM controller partition (DCP1) subsystem 1500. Within the MRC subsystem 1400, the mrc_csk module 1402 contains the FSM (csk_fsm) 602 as described with respect to FIG. 6, the CSRs (csk_csr_core) 1404 as described herein with respect to FIGS. 5A through 5F, and other supporting hardware. FIG. 14 shows an expanded hierarchy of the MRC subsystem 1400.

Within DCP1 subsystem 1500, the clock shrink logic, as described with respect to FIGS. 8A, 8B, and 9, is located within the RCLK post-PLL controller (RPPC) module 1502, while the Stop Clock logic, as described with respect to FIG. 13, lives in the pll_interface module 1504.

Figure 15:
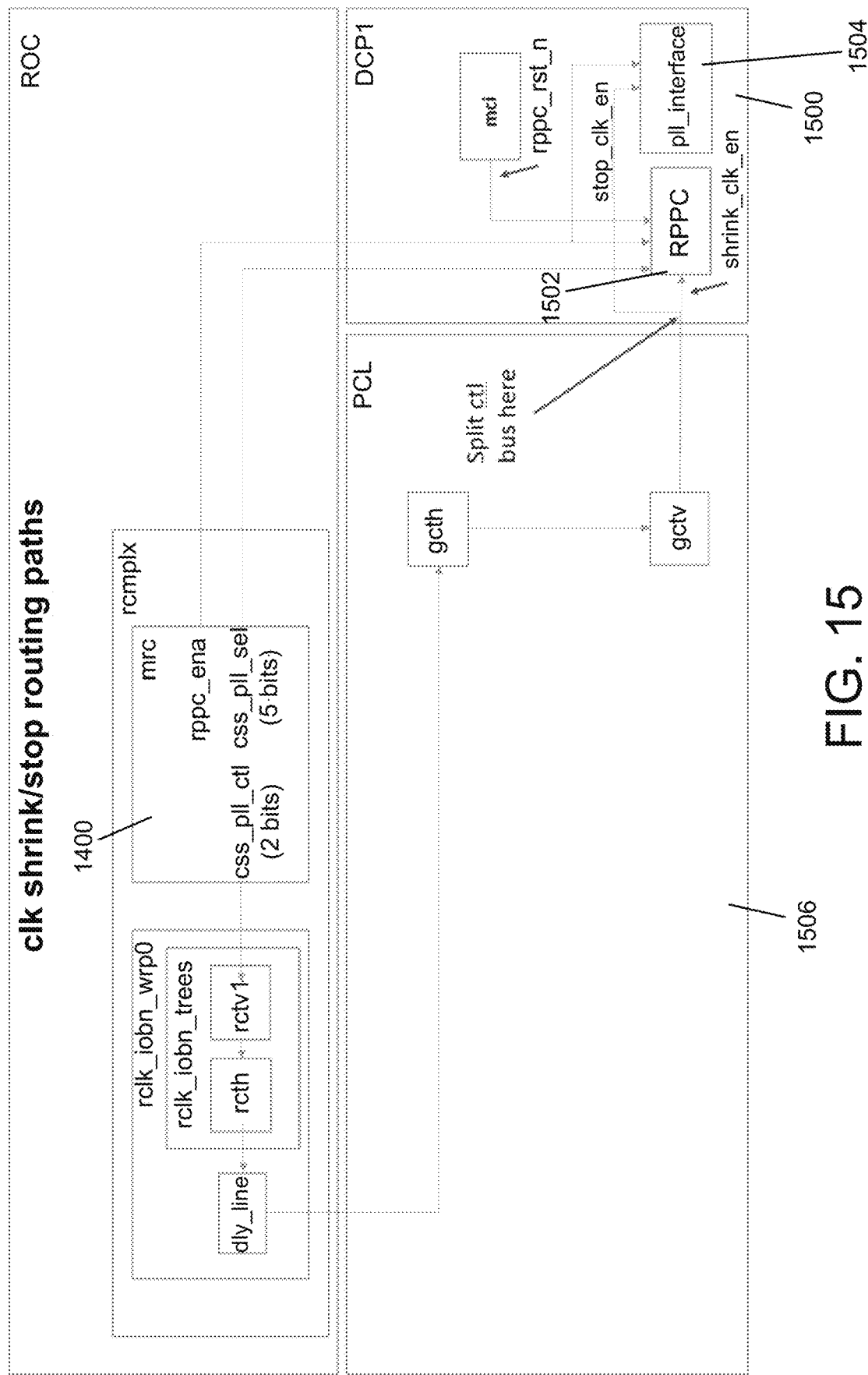
FIG. 15 shows example relative chip-level routing paths according to the invention.

Two structs are sent from the FSM 602 in the MRC subsystem 1400 to the custom logic in the DCP1 subsystem 1500, css_pll_ctl and css_pll_sel. The css_pll_sel struct is asynchronous, thus, it is routed straight from reset of chip (ROC) to the DCP1 subsystem 1500. However, the css_pll_ctl struct is timing critical and is walked up the clock tree through rclk_iobn and PCL 1506 before entering the DCP1 subsystem 1500. When entering the DCP1 subsystem 1500, the css_pll_ctl struct is split into the shrink and stop signals and sent to different destinations, the RPPC module and the pll_interface module, respectively. In the example embodiment, the css_pll_ctl path takes 30 clock cycles to walk up the clock tree, although this value be different in alternative embodiments. In terms of reset and enable signals, the rppc_ena strap is routed from MRC asynchronously to the RPPC module 1502 and the pll_interface module 1504, while rppc_rst_n is routed from the memory controller interface (MCI) locally to the RPPC module 1502. All the relative chip level routing paths are illustrated in FIG. 15.

RPPC Enable Strap

The described embodiments of a failure assessment system, by design (i.e., Stop Clock functionality), can shut down the clocking signals within the host device. An inadvertent assertion of the described embodiment's functionality may therefore cause an IC failure mode. Accordingly, the embodiments may include a facility for disabling the clock shrink feature, the clock stop feature, and other aspects of the failure assessment system. An ability to disable these features may be used to mitigate unforeseen side-effects of the failure assessment system to the primary mission of the IC.

Figure 16:
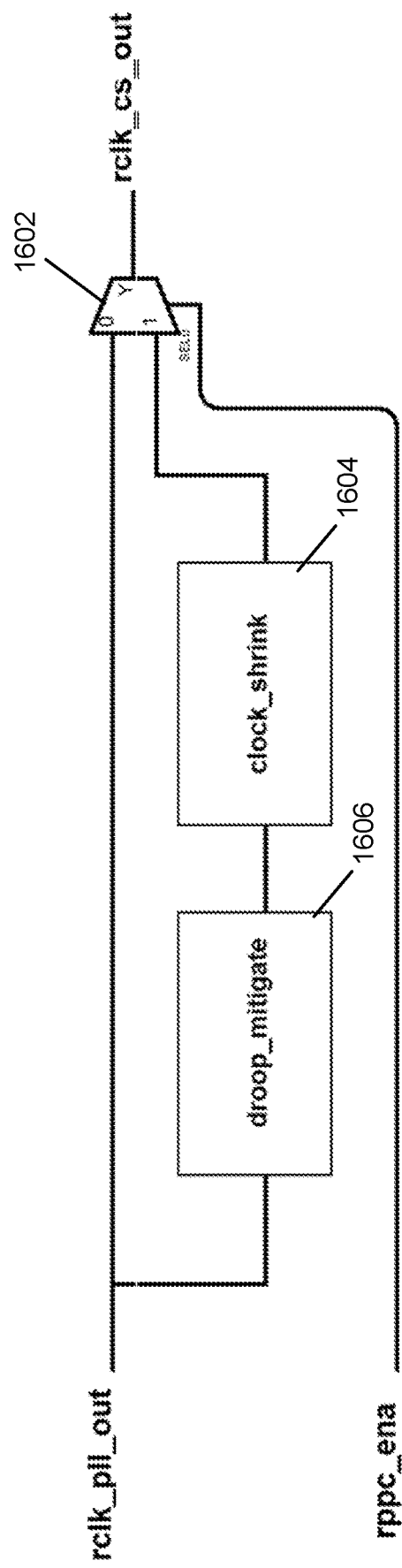
FIG. 16 illustrates an example strap configuration for disabling the clock stop functionality according to the invention.

To implement the disabling facility, a strap set by a pin of the IC may be used to bypass both the clock shrink module 1604 and droop_mitigate logic 1606 in RPPC module 1502 and the stop clock logic 1304 in the pll_interface 1504. Within the RPPC module 1502, the strap rppc_ena controls a multiplexer 1602 at the output of the clock shrink logic 1604, shown in FIG. 16. This allows pll_clk to bypass the droop_mitigate logic 1606 and the clock shrink logic 1604 if necessary. Within the pll_interface 1504, the strap is added as a parameter of the pll_clk_sel mux equation associated with FIG. 13, and will disable the Stop Clock effect when asserted.

Horizontal/Vertical Grid Model

The terms rctv, rcth, gctv, gcth (alternatively rctv/h and gctv/h) are used herein to denote clock trees (clock spines) within the IC. The clock spines are custom circuits used to distribute clock in a particular direction. For example, a vertical tree (rctv, gctv) is used to distribute clock in vertical (Y) dimension across the IC, while a horizontal tree (rcth, gcth) will distribute clock in horizontal (X) dimension.

Figure 17:
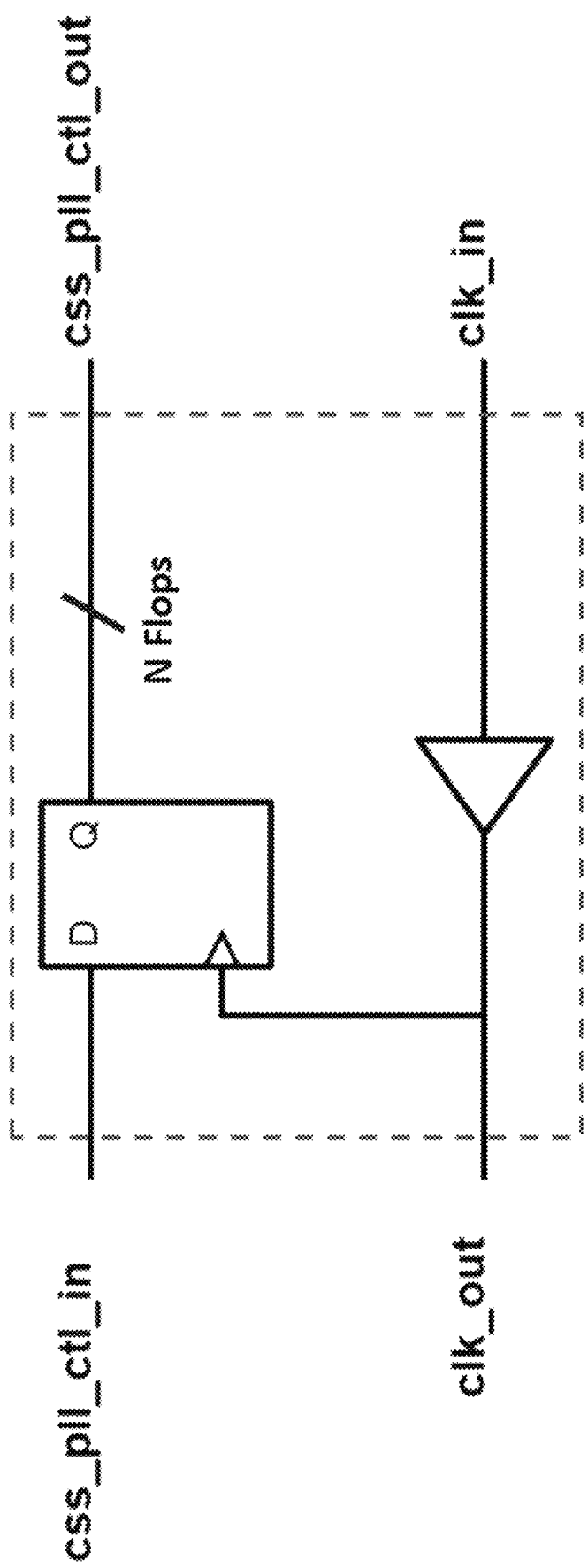
FIG. 17 illustrates an example clocking scheme for walking control signals through a clock tree according to the invention.

To walk the control signals from MRC through the clock tree, rctv/h and gctv/h models include flops clocked by the output clock of each grid, as shown in FIG. 17. The rctv/h models exhibit a three-flop delay while the gctv/h models exhibit a nine-flop delay. The respective flop delays allow the signals to propagate deterministically across the chip. Although the example embodiment exhibits the aforementioned respective delays, alternative embodiments may be characterized by other delays.

Delay Line Model

Figure 18:
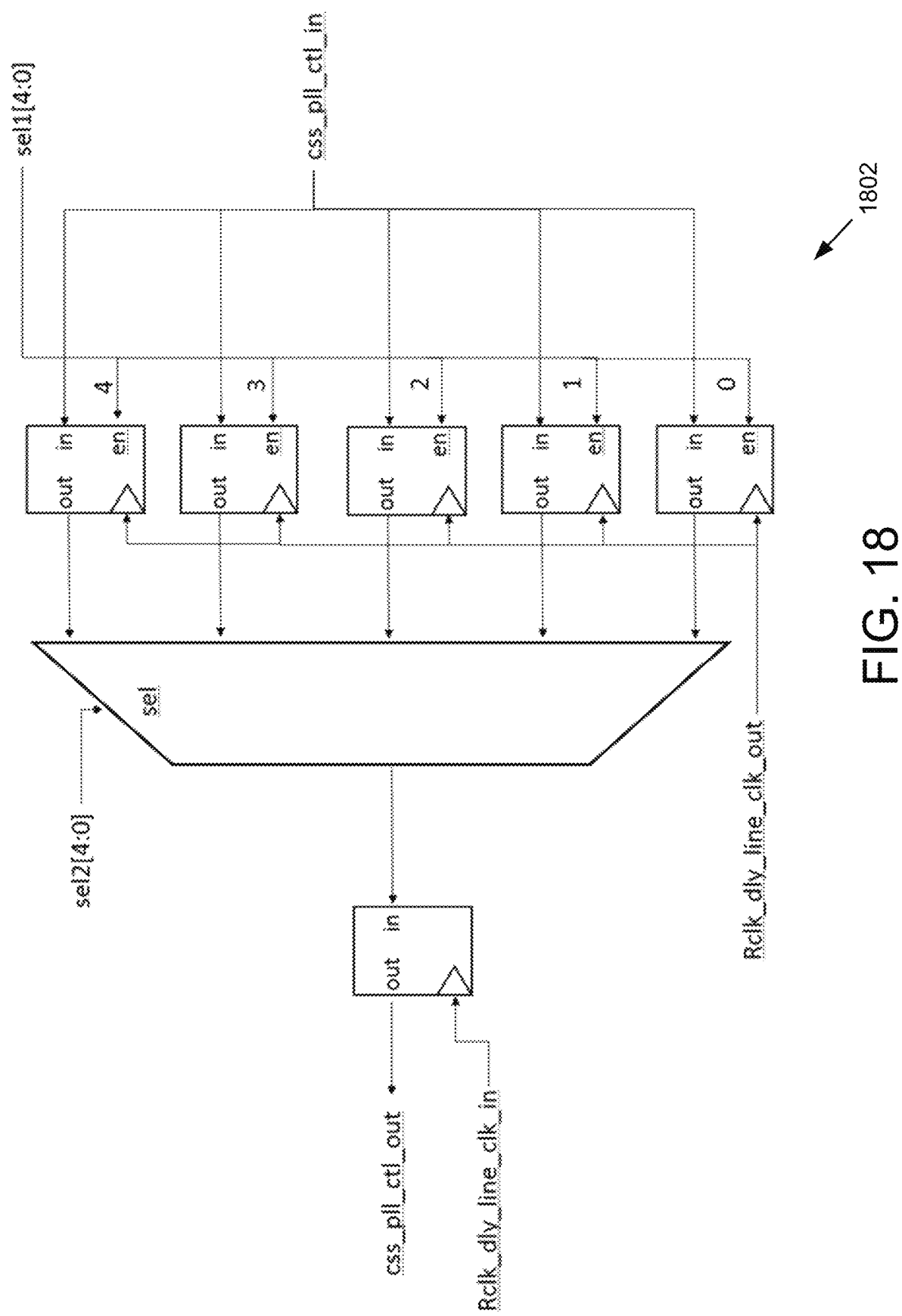
FIG. 18 shows an example asynchronous FIFO according to the invention.
Figure 19:
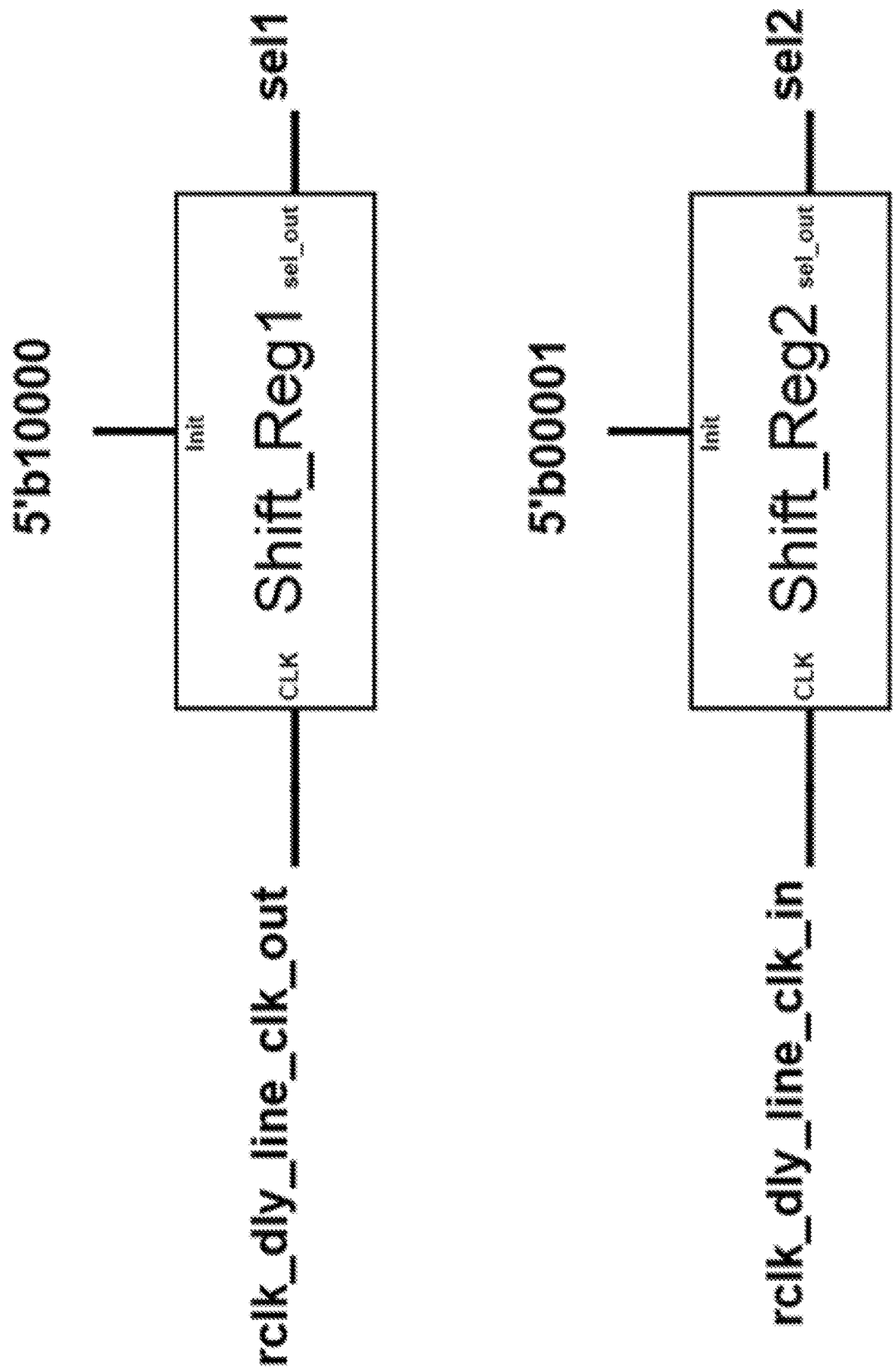
FIG. 19 shows an example generation of select signals for the asynchronous FIFO shown in FIG. 18.

Similar to the delays described above for the clock trees, an example embodiment may implement such delays for the delay lines PDLY 804a and PDLY 804B. Accordingly, the model associated with rclk_dly_line_iobn includes flops to propagate the css_pll_ctl struct through in a defined number of cycles. An asynchronous FIFO 1802 is implemented to assure this behavior by allowing the css_pll_ctl struct to propagate through the delay line in five cycles, despite the fluctuating relationship of the input and output clock, as shown in FIG. 18. The FIFO 1802 is configured such that even with different read and write clocks, there is never a chance that the read and write pointers will access the same register simultaneously. A key aspect of this design is the sel1 and sel2 signals, which are parallel outputs from two shift registers run on the respective input and output clocks, as shown in FIG. 19. These shift registers are initialized to 10000 and 00001 respectively, which creates the 5-cycle propagation delay through the FIFO. The reset signals are similarly processed using flops clocked by the output clock of each grid.

Figure 20:
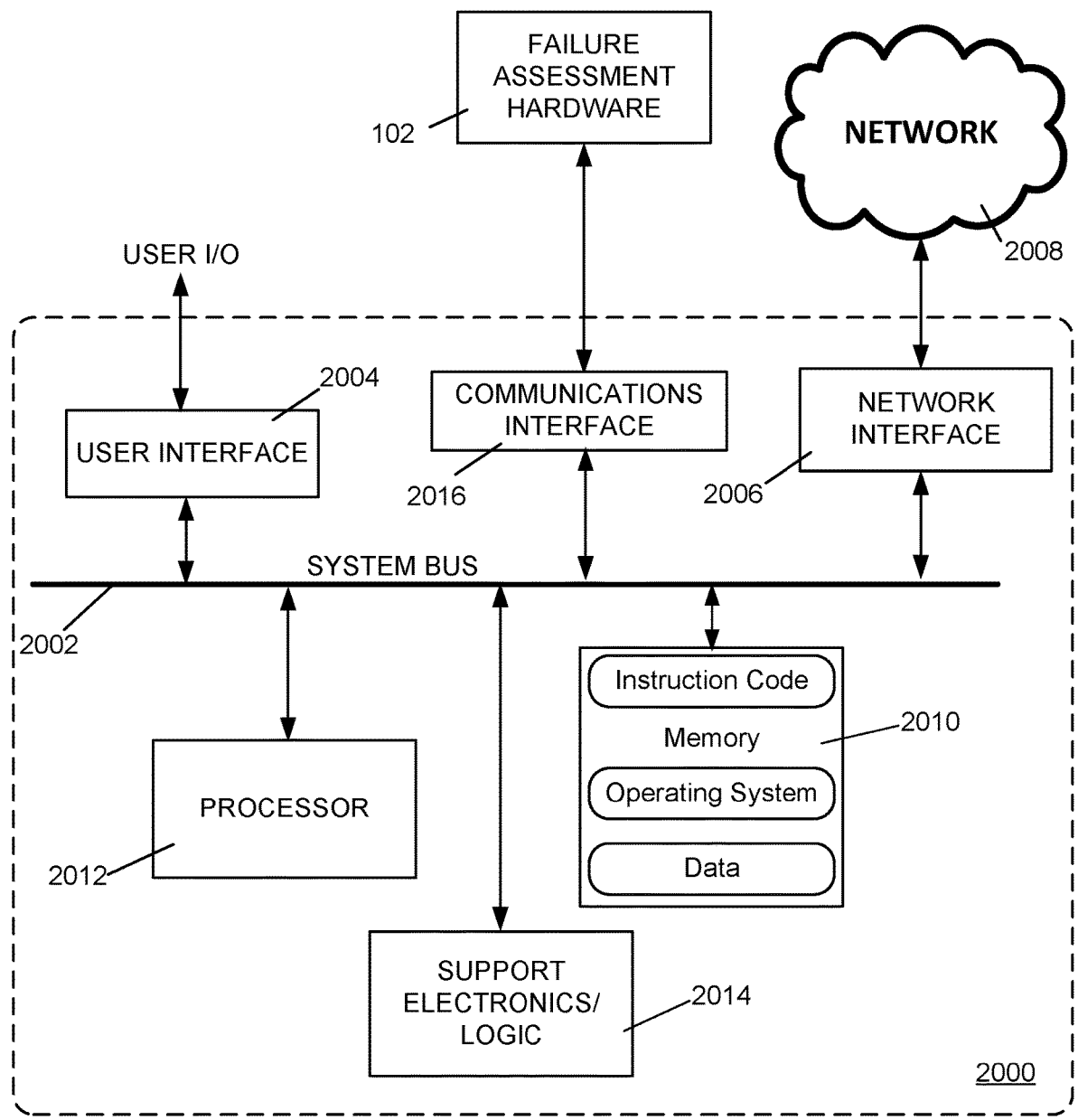
FIG. 20 shows a diagram of an example internal structure of a processing system that may be used to implement one or more of the embodiments described herein.

FIG. 20 is a diagram of an example internal structure of a processing system 2000 that may be used to implement one or more of the embodiments herein. Each processing system 2000 contains a system bus 2002, where a bus is a set of hardware lines used for data transfer among the components of a computer or processing system. The system bus 2002 is essentially a shared conduit that connects different components of a processing system (e.g., processor, disk storage, memory, input/output ports, network ports, etc.) that enables the transfer of information between the components.

Attached to the system bus 2002 is a user I/O device interface 2004 for connecting various input and output devices (e.g., keyboard, mouse, displays, printers, speakers, etc.) to the processing system 2000. A network interface 2006 allows the computer to connect to various other devices attached to a network 2008. Memory 2010 provides volatile and non-volatile storage for information such as computer software instructions used to implement one or more of the embodiments of the present invention described herein, for data generated internally and for data received from sources external to the processing system 2000.

A central processor unit 2012 is also attached to the system bus 2002 and provides for the execution of computer instructions stored in memory 2010. The system may also include support electronics/logic 2014, and a communications interface 2016. The communications interface may comprise an interface to the failure assessment hardware subsystem 102 described with reference to FIG. 1A.

In one embodiment, the information stored in memory 2010 may comprise a computer program product, such that the memory 2010 may comprise a non-transitory computer-readable medium (e.g., a removable storage medium such as one or more DVD-ROM's, CD-ROM's, diskettes, tapes, etc.) that provides at least a portion of the software instructions for the invention system. The computer program product can be installed by any suitable software installation procedure, as is well known in the art. In another embodiment, at least a portion of the software instructions may also be downloaded over a cable communication and/or wireless connection.

It will be apparent that one or more embodiments described herein may be implemented in many different forms of software and hardware. Software code and/or specialized hardware used to implement embodiments described herein is not limiting of the embodiments of the invention described herein. Thus, the operation and behavior of embodiments are described without reference to specific software code and/or specialized hardware—it being understood that one would be able to design software and/or hardware to implement the embodiments based on the description herein.

Further, certain embodiments of the example embodiments described herein may be implemented as logic that performs one or more functions. This logic may be hardware-based, software-based, or a combination of hardware-based and software-based. Some or all of the logic may be stored on one or more tangible, non-transitory, computer-readable storage media and may include computer-executable instructions that may be executed by a controller or processor. The computer-executable instructions may include instructions that implement one or more embodiments of the invention. The tangible, non-transitory, computer-readable storage media may be volatile or non-volatile and may include, for example, flash memories, dynamic memories, removable disks, and non-removable disks.

While example embodiments have been particularly shown and described, it will be understood by those skilled in the art that various changes in form and details may be made therein without departing from the scope of the embodiments encompassed by the appended claims.

What is claimed is:

1. A system for performing a failure assessment of an integrated circuit (IC), comprising:
   a hardware subsystem disposed on the IC, the hardware subsystem configured to change a duration of one or more cycles of a clocking signal on the IC, and to stop the clocking signal at a selected clock cycle of the clocking signal; and
   a control subsystem configured to control the hardware subsystem to perform operations of
   (i) change the duration of one or more selected clock cycles of the clocking signal across a search block of clock cycles;
   (ii) perform a binary search across the search block of clock cycles, such that the selected clock cycles having a changed duration are temporally placed at selected different locations within the search block of clock cycles;
   (iii) at each iteration of the binary search, determine when a failure occurs;
   (iv) when the binary search indicates a single clock cycle associated with the failure, stop transitions of the clocking signal at the single clock cycle; and
   (v) extract data from one or more circuit components of the IC.

2. The system of claim 1, wherein the control subsystem comprises (a) a processor and (b) a memory with computer code instructions stored thereon, the memory operatively coupled to the processor such that, when executed by the processor, the computer code instructions cause the system to implement the operations performed by the hardware subsystem.

3. The system of claim 1, wherein the failure is determined by an evaluation of a data vector produced by the IC, the evaluation comprising a comparison of the data vector to an expected data vector.

4. The system of claim 1, wherein the hardware subsystem further comprises:
   (a) a clock shrink logic module, comprising
      (a1) a clock multiplexer select submodule configured to generate a select signal,
      (a2) a clock multiplexer configured to generate a shrink clock,
      (a3) an odd/even state machine configured to generate one or more control signals for the clock multiplexer select submodule, and
      (a4) an input register submodule configured to supply control parameters to the clock multiplexer select submodule; and
   (b) a clock stop logic module.

5. The system of claim 4, wherein the clock multiplexer, based on the select signal, selects one of a primary clock signal and a delayed version of the primary clock signal to generate the shrink clock signal.

6. The system of claim 1, wherein the search block of clock cycles is established with a start index and a stop index, and wherein one of the start index and the stop index is moved to a midpoint of the search block of clock cycles following an iteration of the binary search, based on where the failure occurred within the search block of clock cycles.

7. The system of claim 6, wherein the one or more clock cycles undergoing a change of duration occurs every other clock cycle of the clocking signal, and wherein the one or more clock cycles undergoing a change of duration occurs in one of even positions and odd positions of the search block.

8. The system of claim 7, wherein each iteration of the binary search produces a block with clock cycles undergoing a change of duration in even positions, followed by a block with clock cycles undergoing a change of duration in odd positions.

9. The system of claim 7, wherein the binary search maintains the start index as one of the even position and the odd position throughout the iterations of the binary search.

10. The system of claim 1, wherein the control subsystem controls the hardware subsystem by writing control information to at least one control and status register (CSR).

11. A method of performing a failure assessment of an integrated circuit (IC), comprising:
   by a control subsystem cooperating with a hardware subsystem to perform the steps of
   (i) changing a duration of one or more selected clock cycles of a clocking signal across a search block of clock cycles;
   (ii) performing a binary search across the search block of clock cycles, such that the selected clock cycles having a changed duration are temporally placed at selected different locations within the search block of clock cycles;
   (iii) at each iteration of the binary search, determining when a failure occurs;

(iv) when the binary search indicates a single clock cycle associated with the failure, stopping transitions of the clocking signal at the single clock cycle; and (v) extracting data from one or more circuit components of the IC.

12. The method of claim 11, wherein the control subsystem cooperating with the hardware subsystem comprises a processor operatively coupled to a memory with computer code instructions stored thereon such that, when executed by the processor, the computer code instructions cause the recited steps to be performed.

13. The method of claim 11, further comprising selecting, based on a select signal, one of a primary clock signal and a delayed version of the primary clock signal to generate a shrink clock signal.

14. The method of claim 11, further comprising establishing a search block of clock cycles with a start index and a stop index, wherein one of the start index and the stop index is moved to a midpoint of the search block of clock cycles following an iteration of the binary search, based on where the failure occurred within the search block of clock cycles.

15. The method of claim 14, further causing the one or more clock cycles undergoing a change of duration to occur every other clock cycle of the clocking signal, wherein the one or more clock cycles undergoing a change of duration occurs in one of even positions and odd positions.

16. The method of claim 15, further causing each iteration of the binary search to produce a block with clock cycles undergoing a change of duration in even positions, followed by a block with clock cycles undergoing a change of duration in odd positions.

17. The method of claim 15, further causing the binary search to maintain the start index as one of the even position and the odd position throughout the iterations of the binary search.

18. The method of claim 11, further causing the data to be extracted from one or more circuit components of the IC through a scan chain of one or more circuit components of the IC.

19. The method of claim 11, further controlling the hardware system by writing control information to at least one control and status register (CSR).

20. The method of claim 11, wherein changing the duration of the one or more selected clock cycles of the clocking signal further comprises one of (i) shortening the one or more selected clock cycles from rising edge to rising edge by shortening a positive phase of the one or more selected clock cycles, (ii) shortening the one or more selected clock cycles from rising edge to rising edge by shortening a negative phase of the one or more selected clock cycles, (iii) shortening the one or more selected clock cycles from falling edge to falling edge by shortening the positive phase of the one or more selected clock cycles, and (iv) shortening the one or more selected clock cycles from falling edge to falling edge by shortening the negative phase of the one or more selected clock cycles.

* * * * *